(12) United States Patent
Lien et al.

(10) Patent No.: US 6,266,263 B1
(45) Date of Patent: Jul. 24, 2001

(54) CAM ARRAY WITH MINIMUM CELL SIZE

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/678,502

(22) Filed: Oct. 2, 2000

(51) Int. Cl.$^7$ .................................................. G11C 15/00
(52) U.S. Cl. ........................................ 365/49; 365/189.07
(58) Field of Search ..................... 365/49, 168, 189.07, 365/189.08

(56) References Cited

U.S. PATENT DOCUMENTS

| | | | |
|---|---|---|---|
| 5,359,564 | * 10/1994 | Iiu et al. ................................. | 365/49 |
| 5,841,874 | 11/1998 | Kempke et al. . | |
| 6,128,207 | * 10/2000 | Lien et al. ............................. | 365/49 |
| 6,199,140 | * 3/2001 | Srinivasan et al. .................. | 711/108 |

OTHER PUBLICATIONS

"Content Addressable Memory Match Line Power Reduction", IBM Technical Disclosure Bulletin, Jan. 1993, vol. 36, Issue No. 1, p. No. 200–202.*

"Content Addressable Memory Cell With Bit Mask", IBM Technical Disclosure Bullentin, Mar. 1988, vol. 30, Issue No. 10, p. No. 414–417.*

* cited by examiner

Primary Examiner—David Nelms
Assistant Examiner—Gene N. Auduong
(74) Attorney, Agent, or Firm—Bever, Hoffman & Harms, LLP

(57) ABSTRACT

A CAM cell array is disclosed in which a comparator function is performed by incorporating a selected transistor of each CAM cell latch into a signal path extending between a match line and a second (e.g., charge or discharge) line. A first terminal of the selected transistor is connected to the match line (or the second line), a second terminal is connected to an internal node of the latch, and a gate terminal of the selected transistor is controlled by the data value stored in the latch. The internal node of the latch is connected through a control transistor having a gate terminal connected to receive an applied data value. When the applied data value is equal to the stored data value, the match line is coupled to the second line along a signal path passing through the selected transistor and the pass transistor. During programming (i.e., when data values are written to the latch), the match line (or second line) carries a low/high voltage signal needed to set (flip) the latch into a desired state.

36 Claims, 18 Drawing Sheets

CAM ARRAY WITH MINIMUM CELL SIZE

FIELD OF THE INVENTION

The present invention relates to content addressable memory (CAM) arrays. More specifically, the present invention relates to ternary and higher order CAM cells and methods for operating these cells in a CAM array.

DISCUSSION OF RELATED ART

Unlike conventional random access memory (RAM) arrays, CAM arrays include memory cells that are addressed in response to their content, rather than by a physical address within a RAM array. That is, data words stored in a RAM array are accessed by applying address signals to the RAM array input terminals. In response to each unique set of address signals, a RAM array outputs a data value that is read from a portion of the RAM array designated by the address. In contrast, a CAM array receives a data value that is compared with all of the data values stored in rows of the CAM array. In response to each unique data value applied to the CAM array input terminals, the rows of CAM cells within the CAM array assert or de-assert associated match signals indicating whether or not one or more data values stored in the CAM cell rows match the applied data value.

CAM arrays are useful in many applications, such as search engines. For example, assume an employee list is searched to identify all employees with the first name "John". The first names are written into a CAM array such that they are stored in a predetermined order (e.g., according to employee number). The compare data value ("John") is then applied to the CAM input terminals. When one or more stored data values match the compare data value (a match condition), the match line coupled to the one or more matching rows of CAM cells generates a match value (e.g., a logic highvalue) output signal. The rows having CAM cells having stored data values that do not match the compare data value (a no-match condition) generate a no-match value (e.g., a logic low value) output signal on the associated match lines. By identifying which rows have associated high match lines, and comparing those row numbers with the employee number list, all employees named "John" are identified. Note that some CAM arrays generate a logic low value as a match value output signal. In contrast, to search a RAM array containing the same employee list, a series of addresses must be applied to the RAM array so that each stored data value is read out and compared with the "John" data value. Because each RAM read operation takes one clock cycle, a relatively large amount of time is required to read and compare a particular data value with all data values stored in a RAM array.

CAM cells are typically defined by the number of data values that they store. For example, binary CAM cells stores one of two logic values: a logic high value or a logic low value. Ternary CAM cells store one of three logic values: a logic high value, a logic low value, and a "don't care" logic value. A "don't care" logic value is a logic value that produces a match condition for any applied compare data value. Higher order CAM cells store additional data values. For example, a CAM cell storing four states will have one of a logic high value, a logic low value, a logic high "don't care" value, and a logic low "don't care" value. Thus, a CAM cell storing four states beneficially stores a data value (e.g., a high or low value) and simultaneously indicates whether that data value is to be involved in a match operation (e.g., a logic high or a logic high "don't care"). As a result, a read operation on a four-state CAM cell storing a "don't care" value distinguishes the "don't care" value read from the CAM cell as either a logic high "don't care" value or a logic low "don't care" value.

When the logic value stored in a ternary CAM cell matches an applied data value, assuming all other CAM cells coupled to the CAM array row also match, then the voltage on the match line coupled to the ternary CAM cell is maintained at the match value (e.g., a logic high value), thereby indicating that a match has occurred. In contrast, when the logic value stored in the ternary CAM cell does not match an applied data value, then the voltage on the match line coupled to the ternary CAM cell is changed to the no-match value (e.g., pulled down to a logic low value), thereby indicating that a match has not occurred. A ternary CAM cell storing a "don't care" value will provide a match condition for any data value applied to that CAM cell. This "don't care" capability allows CAM arrays to indicate when a data value matches a selected group of ternary CAM cells in a row of the CAM array. For example, assume each row of a ternary CAM array has eight ternary CAM cells. Additionally assume that the each of the first four ternary CAM cells of each row each store one of a logic high and a logic low value (for comparison to the first four bits of an input 8-bit data value) and the each of the last four ternary CAM cells of each row store "don't care" values. Under these conditions, when an 8-bit data value is applied to the ternary CAM array, a match occurs for each row of the CAM array in which the data values stored in the first four ternary CAM cells match the first four bits of the applied 8-bit data value. A read operation for all eight ternary CAM cells will provide meaningful data (e.g., a logic high or logic low value) for each of the first four ternary CAM cells, but only a "don't care" value for each of the last four ternary CAM cells.

A four-state CAM cell operates similarly to the ternary CAM cell described above. However, the "don't care" data capability of the four-state CAM cell additionally allows meaningful "don't care" data (e.g., a logic high "don't care" or a logic low "don't care") to be stored in the CAM cell. For example, assume each row of a four-state CAM array has eight four-state CAM cells. Additionally assume that the each of the first four four-state CAM cells of each row each store one of a logic high and a logic low value (for comparison to the first four bits of an input 8-bit data value) and the each of the last four four-state CAM cells of each row store one of a logic high "don't care" and a logic low "don't care" value. Similar to the ternary CAM cell example above, under these conditions, when an 8-bit data value is applied to the four-state CAM array, a match occurs for each row of the CAM array in which the data values stored in the first four four-state CAM cells match the first four bits of the applied 8-bit data value. However, a read operation for all eight four-state CAM cells will provide meaningful data (e.g., a logic high "don't care" or a logic low "don't care) for each of the last four four-state CAM cells as well as meaningful data (e.g., a logic high or logic low value) for each of the first four four-state CAM cells.

FIG. 1 is a schematic diagram of a conventional ternary CAM cell 100. CAM cell 100 includes two 6-transistor (6-T) static random access memory (SRAM) cells 101A and 101B (i.e., storage elements 101A and 101B) and a 4-T exclusive-NOR circuit 101C (i.e., comparator 101C). Thus, CAM cell 100 is a 16-T CAM cell. SRAM cell 101A includes n-channel transistors 110, 111, 114, and 115 and p-channel transistors 122 and 123. Transistors 114, 115, 122, and 123 are cross-coupled to form a storage latch having storage node $N_1$ and inverted storage node $N_1\#$. Access transistors 110 and 111 couple storage node $N_1\#$ and $N_1$, respectively, to inverted bit line $B_1\#$ and bit line $B_1$, respectively. Similarly, SRAM cell 101B includes n-channel transistors 116 and 117 and p-channel transistors 124 and 125, which are cross-coupled to form a storage latch having node $N_2$ and inverted storage node $N_2\#$, and access transistors 112 and 113, which couple storage nodes $N_2\#$ and $N_2$, respectively, to inverted bit line $B_2\#$ and bit line $B_2$, respectively. Exclusive NOR circuit 101C includes n-channel transistors 118–121. Transistors 120 and 118 are coupled in series between the match line and a steady state supply source (i.e., $V_{SS}$ or ground). The gate of transistor 120 is coupled to node $N_1$ and the gate of transistor 118 is coupled to an inverted data line $D_1\#$. Similarly transistors 121 and 119 are coupled in series between the match line and the steady state supply source. The gate of transistor 121 is coupled to node $N_2\#$ and the gate of transistor 119 is coupled to an data line $D_1$.

CAM cell 100 stores one of a logic high, a logic low, and a logic "don't care" value by selectively storing data values in nodes $N_1$ and $N_2$, and inverted data values in nodes $N_1\#$ and $N_2\#$, during a write operation. During subsequent read operations, the values stored in nodes $N_1$, $N_2$, $N_1\#$ and $N_2\#$ are provided on bit lines $B_1$ and $B_2$ and inverted bit lines $B_1\#$ and $B_2\#$, respectively. During a compare operation, the value stored in node $N_2\#$ is compared to a data value and the value stored in node $N_1$ is compared to an inverted data value. Depending upon the outcome of this comparison, the match line $MATCH_1$ is either maintained in a charged state (indicating a match condition) or discharged to ground (indicating a no-match condition) in response to the applied data and inverted data values. As used herein, the term "discharged" means a voltage state is changed. Thus, in one embodiment, "discharged" may mean a logic high value of a match line is discharged to a logic low value or ground. In another embodiment, "discharged" may mean a logic low value of a match line is discharged to a logic high value or the $V_{CC}$ voltage supply source.

A problem with conventional CAM cell 100 is that the 16 transistors forming CAM cell 100 take up valuable chip area. It is preferred to minimize the number of transistors required to perform a function to maximize available chip area. Another problem with conventional CAM cell 100 is the space required by the six bit lines (i.e., $B_1$, $B_1\#$, $B_2$, $B_2\#$, $D_{1A}$, and $D_{1B}\#$) coupled to CAM cell 100. These many connections similarly occupy valuable chip area. It would therefore be desirable to have a CAM cell having a minimized area that is capable of storing at least three values.

FIG. 2 is a schematic diagram of another conventional ternary CAM cell 200 as described in U.S. Pat. No. 5,841,874. CAM cell 200 includes two 5-T memory cells 120 and 130 (i.e., storage elements 120 and 130) and a 4-T comparator circuit 150 (i.e., comparator 150). Thus, CAM cell 200 is a 14-T CAM cell. Memory cell 120 includes transistors 210 and 220–223. Memory cell 130 includes transistors 230–234. Comparator circuit 150 includes transistors 251–254. Transistors 220–223 are cross-coupled to form a storage latch. Access transistor 210 couples the gates of transistors 220 and 222 (i.e., the storage node, RA, of cross-coupled transistors 221 and 223) to bit line A. Transistors 230–233 are cross-coupled to form a storage latch. Access transistor 234 couples the gates of transistors 231 and 233 (i.e., the storage node of cross-coupled transistors 230 and 232 that is the inverse of the value stored in storage node RB) to bit line B.

Similarly to CAM cell 100, CAM cell 200 stores one of a logic high, a logic low, and a logic "don't care" value by selectively storing data values in memory cells 120 and 130 during a write operation. During subsequent read operations, the values stored in memory cells 120 and 130 are provided on bit lines A and B, respectively. During a compare operation, the value stored in memory cell 120 is compared to a first data value applied to bit line B and the value stored in memory cell 130 is compared to a data value applied to bit line A in comparator 150. Depending upon the outcome of this comparison, the match line MATCH is either maintained in a charged state (indicating a match) or discharged to ground (indicating a no-match) in response to the applied data and inverted data values.

While CAM cell 200 has fewer transistors than CAM cell 100, thereby occupying a smaller chip area, a write operation of logic high values in CAM cell 200 is much more difficult than in CAM cell 100. This difficulty arises because the voltage between a logic low and a logic high value when one bit line is used must accommodate writing a logic low value, reading, and writing a logic high value. Latches easily change state upon the application of a logic low value to a node of the latch storing a logic high value. However, latches must distinguish between the voltage applied during a read operation (and therefore resist a change of state) and the voltage applied when storing a logic high value (and therefore potentially change state). During a write operation, CAM cell 100 either applies a logic low value to node $N_1$, thereby storing a logic low value in CAM cell 100 if node $N_2$ also stores a logic low value, or applies a logic low value to node $N_1\#$, thereby storing a logic high value in CAM cell 100 if node $N_2\#$ also stores a logic low value. As a result, the state of SRAM cell 101A is easily changed. In contrast, memory cell 120 applies a logic low value to memory cell 120 only during some write operations (e.g., while storing a logic low value in memory cell 120). In other write operations, a logic high value is applied to memory cell 120, resulting in the difficult write operation of CAM cell 200 described above.

Read operations in CAM cell 200 are also more difficult than in CAM cell 100. CAM cell 200 must either read data stored in memory cell 120 and 130 from bit lines A and B at the same time, or read the data stored in memory cell 120 through comparator 150 and then read the data stored in memory cell 130 through comparator 150. Reading from bit lines A and B is complicated because of the similarity of the read operation to a write operation. Because bit lines A and B are pre-charged to a logic high value during a read operation from bit lines A and B, at least one of the values of bit lines A and B are similar to the values of bit lines A and B during a write operation. This similarity of values of bit lines A and B may cause a read disturbance of the value stored in memory cells 120 and 130. Additionally, reading from comparator 150 is complicated because of the length of time required to read each memory cell. Because each of memory cells 120 and 130 must be read separately through comparator 150, the read operation of CAM cell 200 using this method requires approximately twice the time required by CAM cell 100. It would be desirable to eliminate these write and read operation complications while minimizing the area occupied by a CAM cell.

SUMMARY

The present invention is directed to an array of CAM cells that utilize selected transistors of the storage latches to perform comparator functions, thereby reducing the size of each CAM cell by reducing the required number of transistors. The comparator function is performed by incorporating a selected (first) transistor of each latch, which is used to store data values in each CAM cell, into a signal path extending between a match line and a second (e.g., charge or discharge) line. Specifically, a first terminal of the selected transistor is connected to the match line (or the second line), a second terminal is connected to an internal node of the latch, and a gate terminal of the selected transistor is controlled by the data value stored in the latch. The internal node of the latch is connected through a control (second) transistor having a gate terminal connected to receive an applied data value. When the applied data value is equal to the stored data value (i.e., when both the selected transistor and the pass transistor are turned on by the stored data value and the applied data value, respectively), the match line is coupled to the second line along a signal path passing through the selected transistor and the pass transistor. Note that during programming (i.e., when data values are written to the latch), the match line (or second line) carries a low/high voltage signal needed to set (flip) the latch into a desired state. Accordingly, at least one transistor of the latch is utilized in the comparator function of the CAM cell, thereby reducing the number of transistor needed to form the CAM cell and minimizing the size of the CAM cell array.

In accordance with the disclosed embodiments, each CAM cell is an SRAM cell including a latch formed by cross-coupled inverters, and connected to one or more bit lines by one or more access transistors. Each inverter of the cross-coupled inverters includes an n-channel transistor and a p-channel transistor connected in series between a voltage source (e.g., $V_{CC}$) and the match line (or second line). The n-channel transistor of at least one of the inverters is used as a selected transistor, and has one terminal connected to the match line (or second line). In some embodiments, an access transistor is used as the second transistor to form the signal path with the n-channel transistor between the match line and the second line. In other embodiments, an additional pass transistor, which is connected in parallel with one of the access transistors, is provided to form the signal path. In yet other embodiments, a third transistor or control circuit is connected in the signal path to control charging/discharging of the match line in accordance with a control signal (e.g., stored by a mask memory cell). In further embodiments, the third transistor is controlled by a voltage level maintained on the match line such that the third transistor is turned off when the match line is sufficiently discharged, thereby saving power by allowing the discharged match line to float above ground.

The present invention will be more fully understood in view of the following description and drawings.

DETAILED DESCRIPTION

Figure 1:
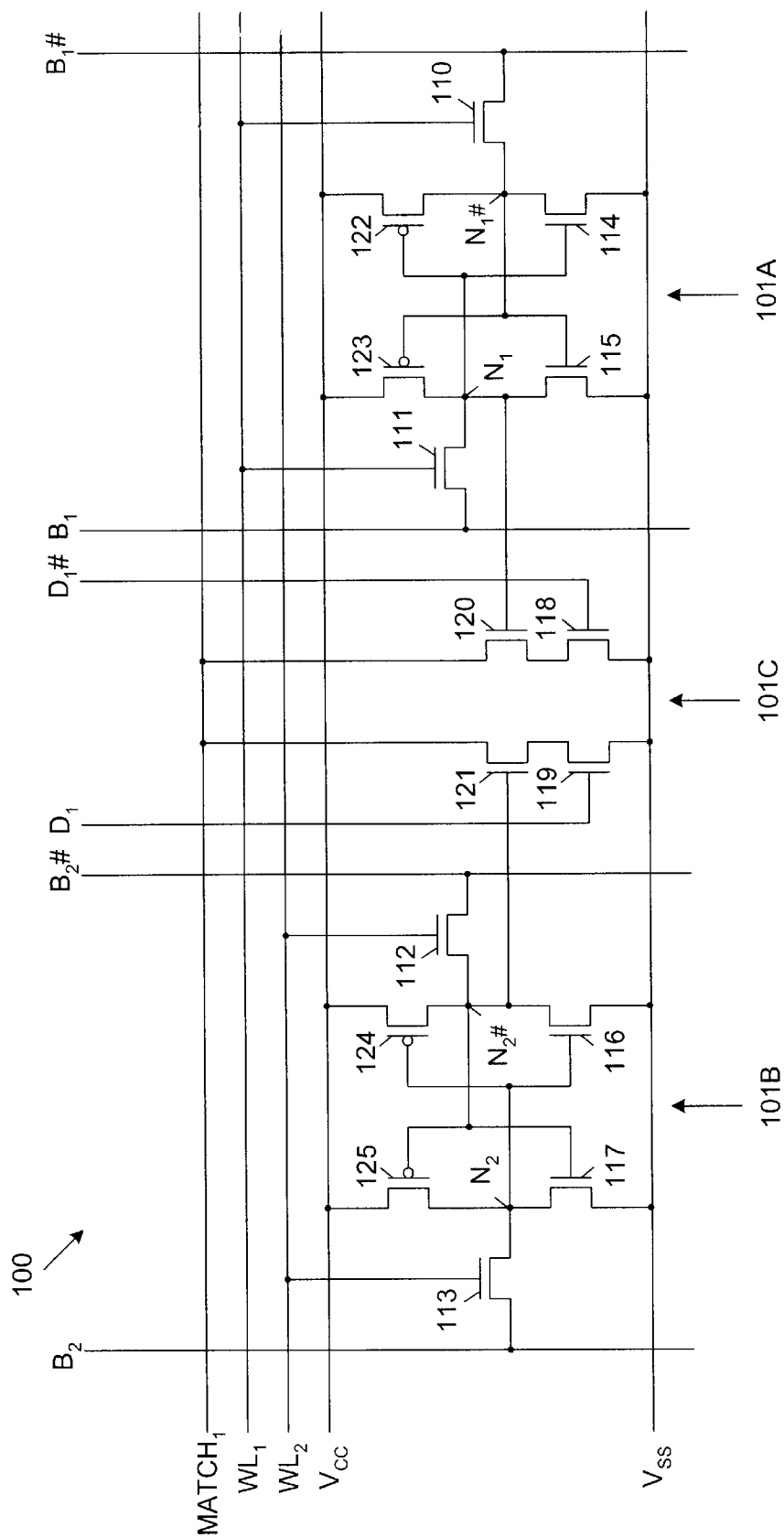
FIG. 1 is a schematic diagram of a conventional ternary CAM cell.
Figure 2:
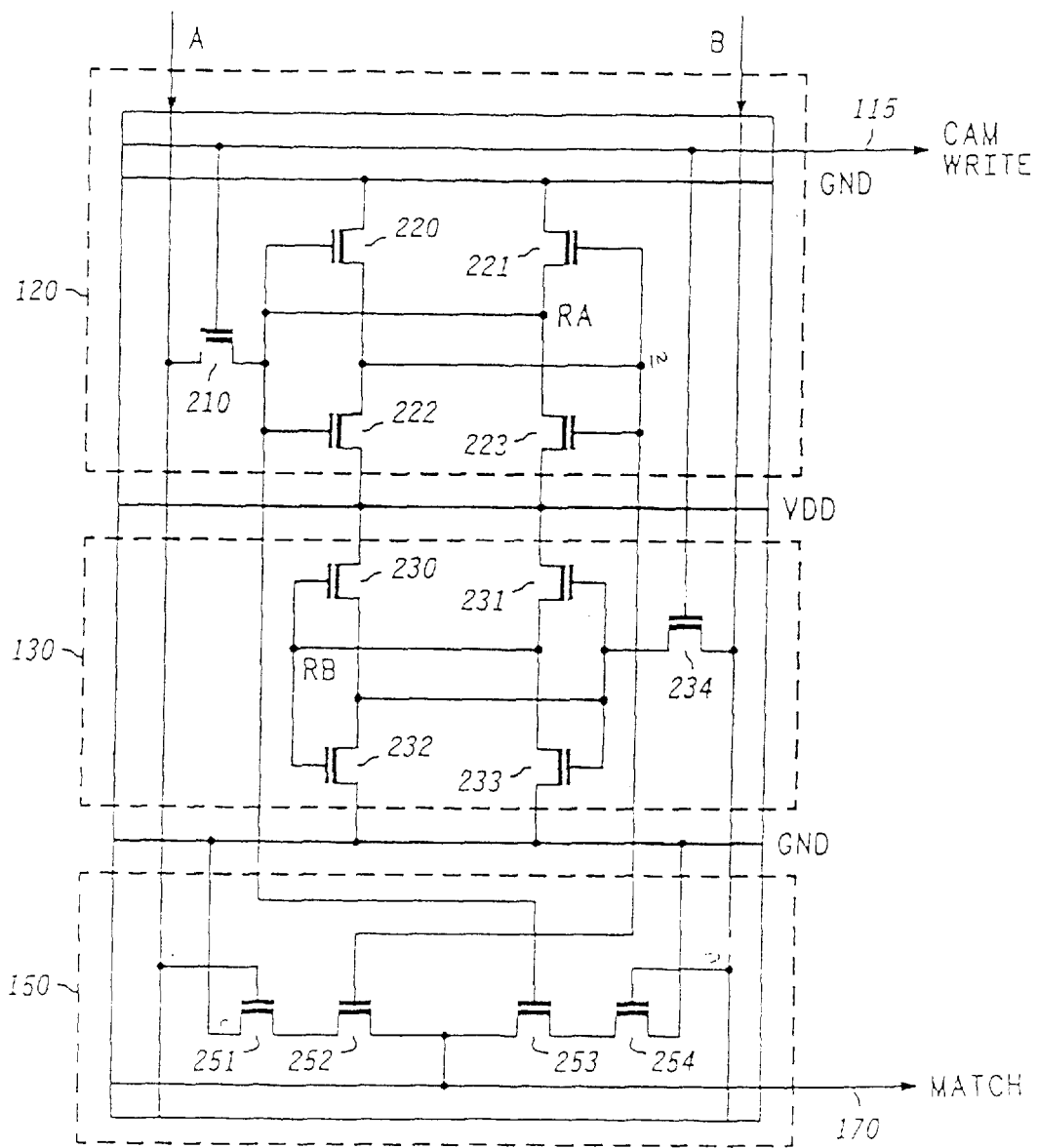
FIG. 2 is a schematic diagram of a conventional ternary CAM cell.
Figure 3A:
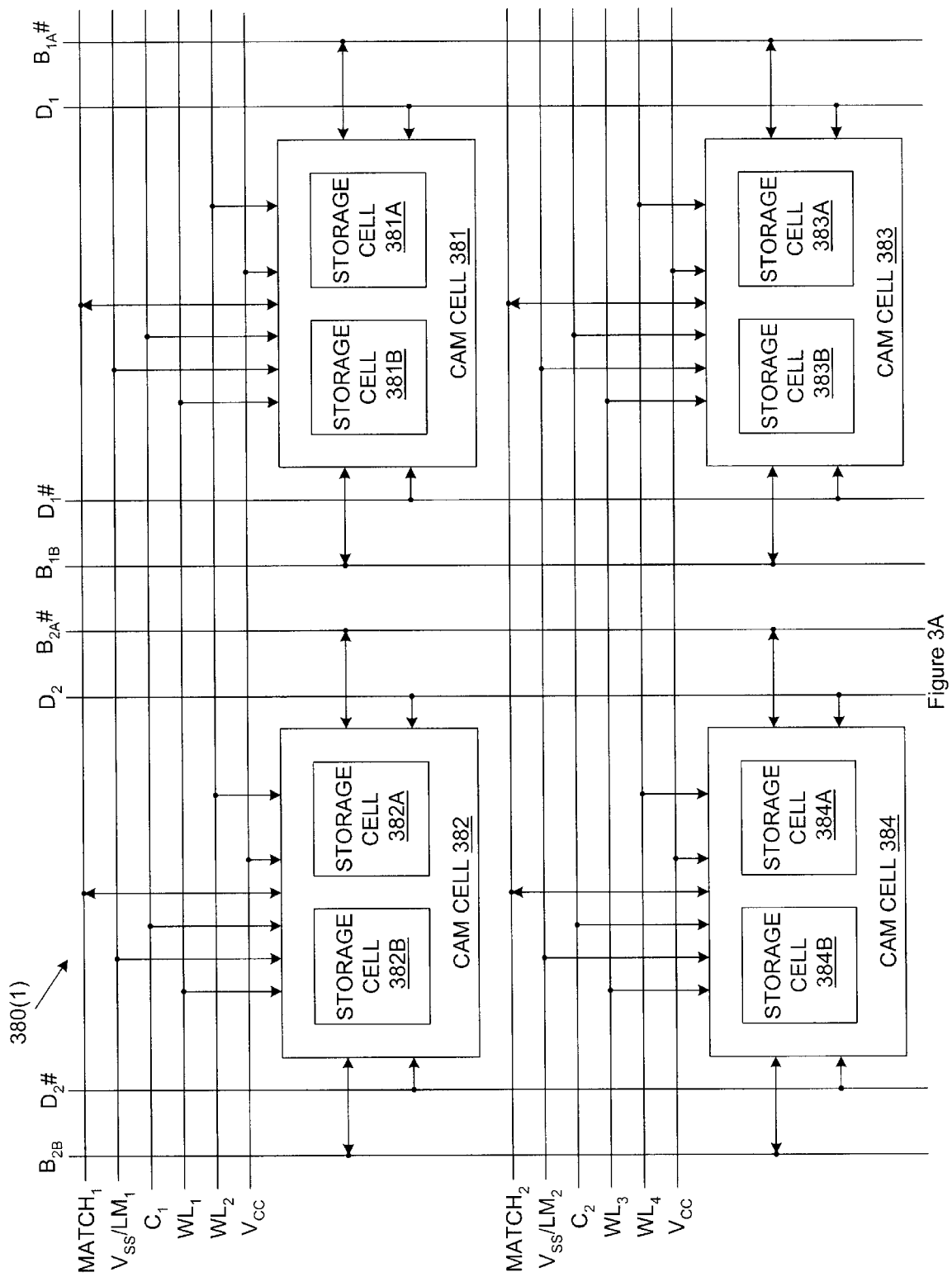
FIG. 3A is a schematic diagram of a ternary CAM array in accordance with an embodiment of the present invention.

FIG. 3A is a simplified schematic diagram showing a portion of a CAM array 380(1) in accordance with the present invention. CAM array 380(1) includes CAM cells 381–384 that are coupled to bit lines $B_{1A}\#$, $B_{1B}$, $B_{2A}\#$, and $B_{2B}$, data lines $D_1$, $D_1\#$, $D_2$, and $D_2\#$, control lines $C_1$ and $C_2$, word lines $WL_1$, $WL_2$, $WL_3$, and $WL_4$, the $V_{CC}$ voltage supply source, the low match line $LM_1$, $V_{SS}$ voltage supply source, and match lines $MATCH_1$ and $MATCH_2$. Storage cells 381A–384A and 381B–384B are each single bit storage cells (e.g., a static random access memory (SRAM) cell). Because each of CAM cells 381–384 store two bits (e.g., CAM cell 381 stores one bit each in storage cells 381A and 381B), each of CAM cells 381–384 are capable of storing one of up to four data values.

Control lines $C_1$ and $C_2$, word lines $WL_1$, $WL_2$, $WL_3$, and $WL_4$, and match lines $MATCH_1$ and $MATCH_2$ isolate a first row of CAM cells (e.g., CAM cells 381 and 382) from a second row of CAM cells (e.g., CAM cells 383 and 384). Bit lines $B_{1A}\#$, $B_{1B}$, $B_{2A}\#$, and $B_{2B}$, and data lines $D_1$, $D_1\#$, $D_2$, and $D_2\#$ isolate one column of CAM cells (e.g., CAM cells 381 and 383) from a second column of CAM cells (e.g., CAM cells 382 and 384). As a result, data may be written to, read from, or compared to a single CAM cell or a combination of CAM cells in CAM array 380(1).

Low match lines $LM_1$ and $LM_2$ are controllable lines coupled to a control circuit such that the voltage of low match lines $LM_1$ and $LM_2$ may be varied. For example, in one embodiment, during a standby operation where a row of cells coupled to low match line $LM_1$ is not active, low match line $LM_1$ may be allowed to float. As a result, a power savings is achieved from the un-powered low match line $LM_1$. However, in another example, in the same embodiment, during a write operation, low match line $LM_1$ may be held to a logic low value. As a result, proper voltages required for the write operation are provided.

Figure 3B:
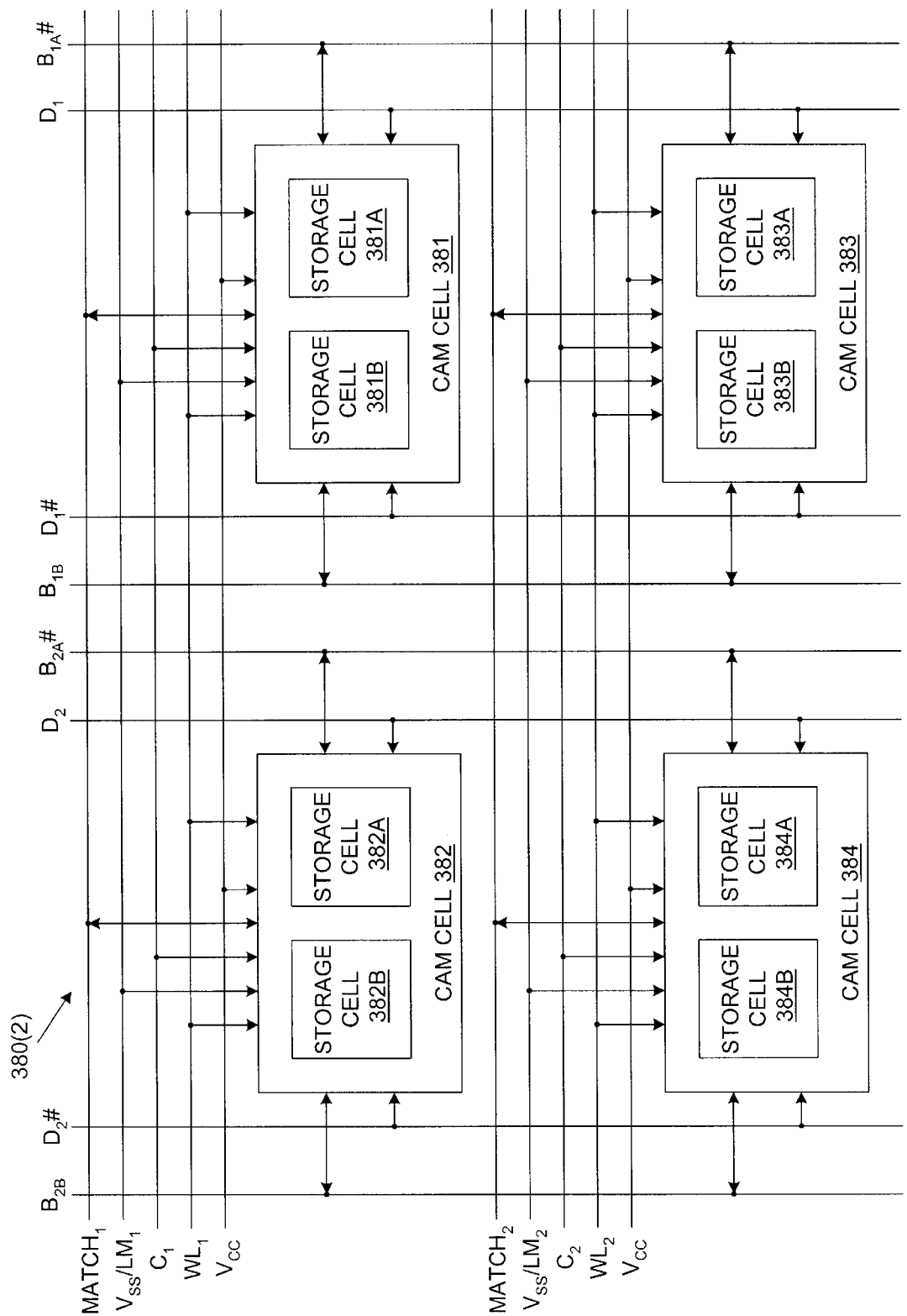
FIG. 3B is a schematic diagram of a ternary CAM array in accordance with another embodiment of the present invention.

FIG. 3B is a simplified schematic diagram showing a portion of a CAM array 380(2) in accordance with another embodiment the present invention. Similar elements in CAM arrays 380(1) (FIG. 3A) and 380(2) are labeled similarly. CAM array 380(2) differs from CAM array 380(1) in the combination of word lines $WL_1$ and $WL_2$ (FIG. 3A) into word line $WL_1$ (FIG. 3B) and the combination of word lines $WL_3$ and $WL_4$ (FIG. 3A) into word line $WL_2$ (FIG. 3B). As a result, the area required to implement CAM array 380(2) is less than the area required to implement CAM array 380(1), because one fewer word line per row is needed.

Figure 3C:
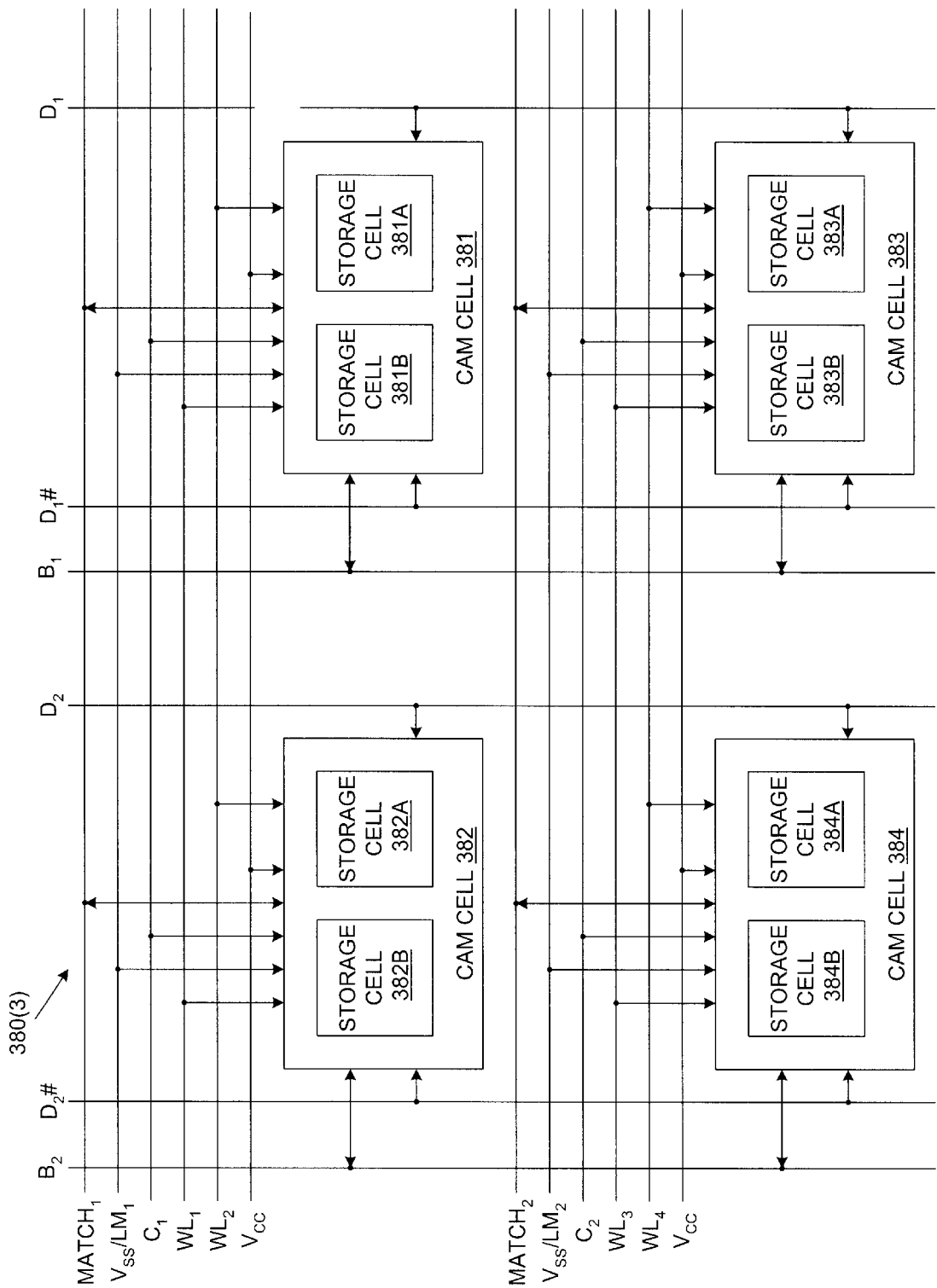
FIG. 3C is a schematic diagram of a ternary CAM array in accordance with another embodiment of the present invention.

FIG. 3C is a simplified schematic diagram showing a portion of a CAM array 380(3) in accordance with another embodiment the present invention. Similar elements in CAM arrays 380(1) (FIG. 3A) and 380(3) are labeled similarly. CAM array 380(3) differs from CAM array 380(1) in the combination of bit lines $B_{1A}\#$ and $B_{1B}$ (FIG. 3A) into bit line $B_1$ (FIG. 3C) and the combination of bit lines $B_{2A}\#$ and $B_{2B}$ (FIG. 3A) into bit line $B_2$ (FIG. 3C). As a result, the area required to implement CAM array 380(3) is less than the area required to implement CAM array 380(1), because one fewer bit line per column is needed.

The operation of CAM array 380(1) is described below with respect to several embodiments. Note that low match lines $LM_1$ and $LM_2$ and the $V_{SS}$ voltage supply source may not necessarily both be present in an embodiment. Additionally, note that not all lines are present in all embodiments. Different embodiments may combine similarly functioning lines, such as combining word lines $WL_1$ and $WL_2$ into one word line (e.g., CAM array 380(2)) or combining bit line $B_{1A}\#$ and $B_{1B}$ into one bit line (e.g., CAM array 380(3)).

First Embodiment: 12-T Ternary CAM Cell

Figure 4A:
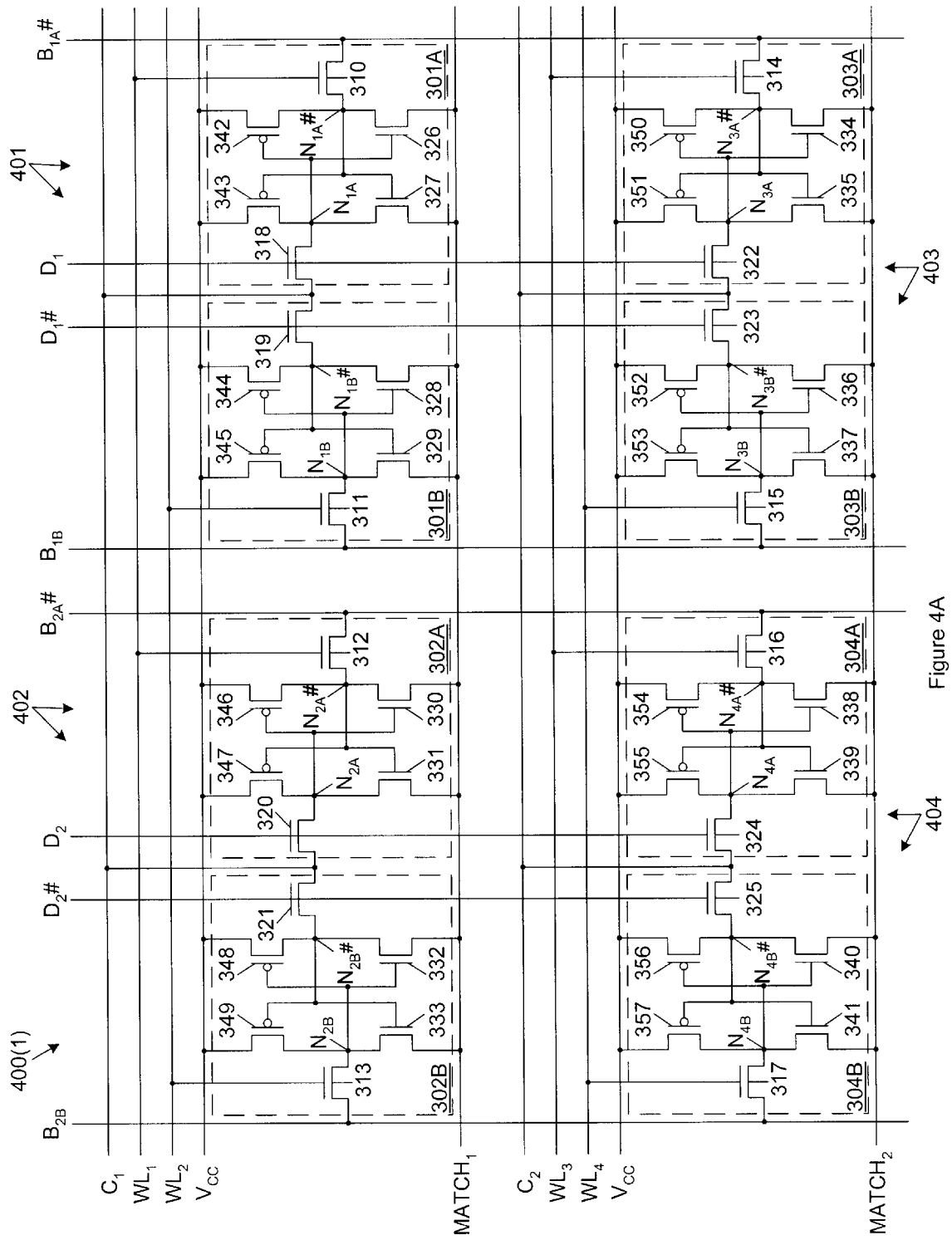
FIG. 4A is a schematic diagram of a CAM array in accordance with an embodiment of the present invention.

FIG. 4A is a schematic diagram showing a portion of a ternary CAM array 400(1) in accordance with a first embodiment of the present invention. CAM array 400(1) includes 12-T ternary CAM cells 401–404 each comprising SRAM cells 301A–304A, respectively and 301B–304B, respectively. SRAM cells 301A–304A and 301B–304B are coupled to bit lines $B_{1B}$, $B_{1A}\#$, $B_{2B}$, and $B_{2A}\#$, data lines $D_1$, $D_1\#$, $D_2$, and $D_2\#$, control lines $C_1$ and $C_2$, word lines $WL_1$, $WL_2$, $WL_3$, and $WL_4$, the $V_{CC}$ voltage supply source, and match lines $MATCH_1$ and $MATCH_2$.

Similar to prior art CAM cell 100 (discussed above), each of CAM cells 401–404 includes a first storage element (e.g., one of SRAM cells 301A–304A) and a second storage element (e.g., one of SRAM cells 301B–304B). SRAM cell 301A includes a pair of inverters formed by transistors 326 and 342 (having output node $N_{1A}$) and transistors 327 and 343 (having output node $N_{1A}\#$), which are cross-coupled to form a storage latch, and access transistors 310 and 318, which are coupled to output nodes $N_{1A}$ and $N_{1A}\#$, respectively. An output node is a storage node where a data value is stored. Similarly, SRAM cell 301B includes a pair of inverters formed by transistors 328 and 344 (having output node $N_{1B}\#$) and transistors 329 and 345 (having output node $N_{1B}$), which are cross-coupled to form a storage latch, and access transistors 311 and 319, which are coupled to output nodes $N_{1B}$ and $N_{1B}\#$, respectively.

Similarly to CAM cell 401, CAM cell 402 includes SRAM cells 302A and 302B. SRAM cell 302A includes cross-coupled inverters formed from transistors 330 and 346 (having output node $N_{2A}$) and 331 and 347 (having output node $N_{2A}\#$), which form a storage latch, and access transistors 312 and 320, which are coupled to output nodes $N_{2A}$ and $N_{2A}\#$, respectively. SRAM cell 302B includes cross-coupled inverters formed from transistors 332 and 348 (having output node $N_{2B}$) and 333 and 349 (having output node $N_{2B}\#$), which form a storage latch, and access transistors 313 and 321, which are coupled to output nodes $N_{2B}$ and $N_{2B}\#$, respectively. CAM cell 403 includes SRAM cells 303A and 303B. SRAM cell 303A includes cross-coupled inverters formed from transistors 334 and 350 (having output node $N_{3A}$) and 335 and 351 (having output node $N_{3A}\#$), which form a storage latch, and access transistors 314 and 322, which are coupled to output nodes $N_{3A}$ and $N_{3A}\#$, respectively. SRAM cell 303B includes cross-coupled inverters formed from transistors 336 and 352 (having output node $N_{3B}$) and 337 and 353 (having output node $N_{3B}\#$), which form a storage latch, and access transistors 315 and 323, which are coupled to output nodes $N_{3B}$ and $N_{3B}\#$, respectively. CAM cell 404 includes SRAM cells 304A and 304B. SRAM cell 304A includes cross-coupled inverters formed from transistors 338 and 354 (having output node $N_{4A}$) and 339 and 355 (having output node $N_{4A}\#$), which form a storage latch, and access transistors 316 and 324, which are coupled to output nodes $N_{4A}$ and $N_{4A}\#$, respectively. SRAM cell 304B includes cross-coupled inverters formed from transistors 340 and 356 (having storage node $N_{4B}$) and 341 and 357 (having storage node $N_{4B}\#$), which form a storage latch, and access transistors 317 and 325, which are coupled to output nodes $N_{4B}$ and $N_{4B}\#$, respectively.

Bit lines $B_{1A}\#$, $B_{1B}$, $B_{2A}\#$, and $B_{2B}$ are coupled to a terminal of access transistors 310–313, respectively and to a terminal of access transistors 314–317, respectively. Data lines $D_1$, $D_1\#$, $D_2$, and $D_2\#$ are coupled to a gate of access transistors 318–321, respectively, and to a gate of access transistors 322–325, respectively. Control line $C_1$ is coupled between terminals of transistors 318 and 319 and between terminals of transistor 320 and 321. Control line $C_2$ is coupled between terminals of transistors 322 and 323 and between terminals of transistors 324 and 325. Word lines $WL_1$, $WL_2$, $WL_3$, and $WL_4$ are coupled to the gates of transistors 310, 311, 314, and 315, respectively, and to the gates of transistors 312, 313, 316, and 317, respectively. The $V_{CC}$ voltage supply source provides power to a terminal of transistors 342–357. Match line $MATCH_1$ is coupled to a terminal of transistors 326–333. Match line $MATCH_2$ is coupled to a terminal of transistors 334–341.

Figure 4B:
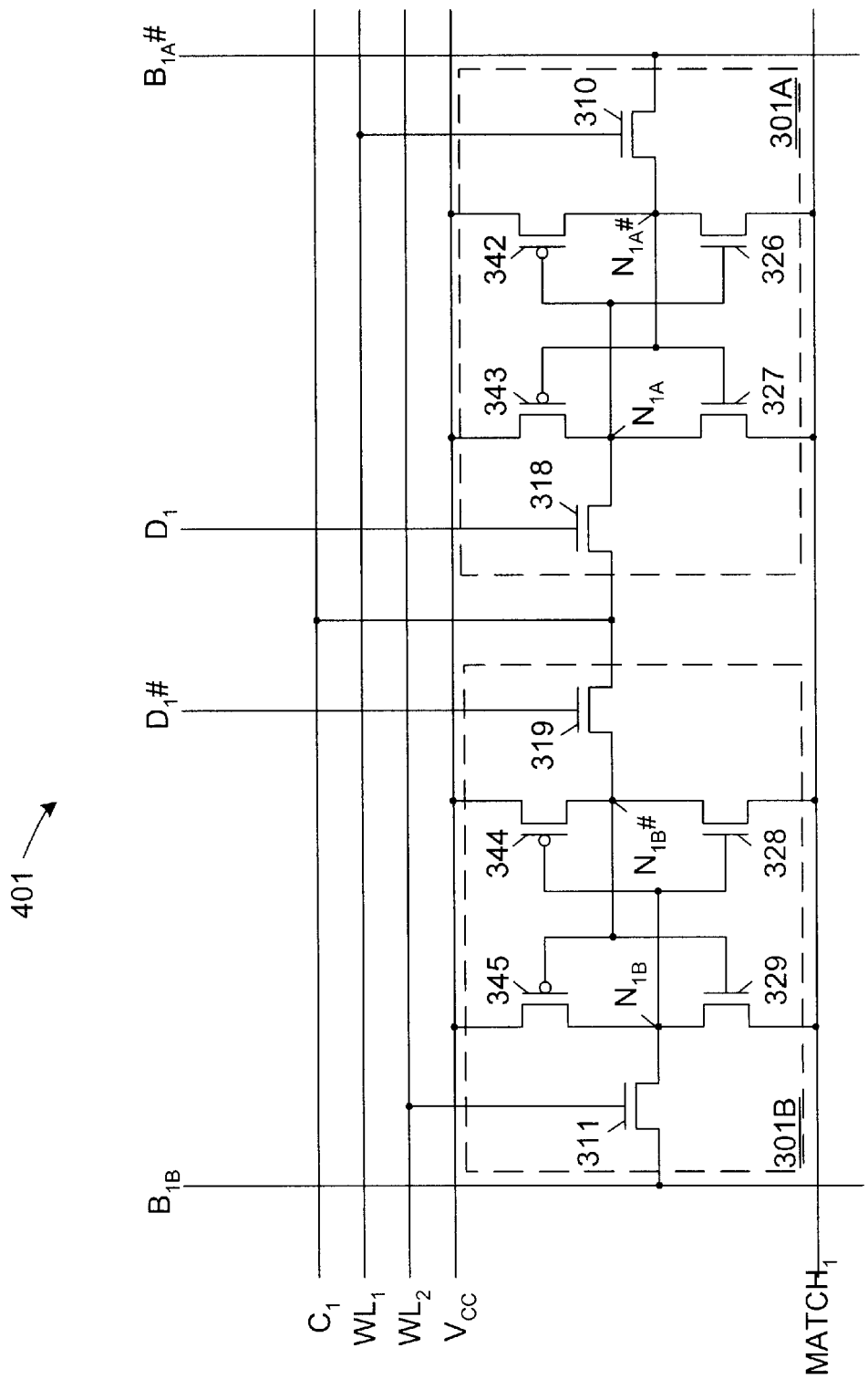
FIG. 4B is a schematic diagram of a ternary CAM cell in accordance with the CAM array of FIG. 4A.

FIG. 4B is a closer view of CAM cell 401 in CAM array 400(1) of FIG. 4A. Thus, this CAM cell comprises SRAM cells 301A and 301B, which include n-channel transistors 310, 311, 318, 319, and 326–329 and p-channel transistors 342–345. SRAM cells 301A and 301B are coupled to bit lines $B_{1B}$ and $B_{1A}\#$, data lines $D_1$ and $D_1\#$, control line $C_1$, word lines $WL_1$ and $WL_2$, the $V_{CC}$ voltage supply source, and match line $MATCH_1$ as described with respect to FIG. 4A.

The operation of an individual CAM cell (e.g., CAM cell 401) in CAM array 400(1) will now be described with reference to FIGS. 4A and 4B. CAM array 400(1) operations include standby, write, read, and compare operations. In a standby operation (standby state), for example, of CAM cell 401, word lines $WL_1$ and $WL_2$ and data lines $D_1$ and $D_1\#$ are pulled down to logic low values, thereby turning off access transistors 310, 311, 318, and 319, respectively. The match line $MATCH_1$ is held to a logic low value and the control line $C_1$ is preferentially left in it's last state. Under these conditions, SRAM cells 301A and 301B latch (i.e., store) the values at nodes $N_{1A}$ and $N_{1B}$ (and the inverted values $N_{1A}\#$ and $N_{1B}\#$), respectively. Other CAM cells in CAM array 400(1) may similarly be held in a standby state. Note that CAM cells within the CAM array that are not undergoing write, read, or compare operations are held in a this standby state or a modified standby state. CAM cells in a standby state that are located in the same row or the same column as a CAM cell or cells undergoing a write, read, or compare operation are not in a true standby state because of the effect of the voltages applied to the CAM cell undergoing the write, read, or compare operation. As a result, these CAM cells are held in a modified standby state. A modified standby state applies all standby conditions to a CAM cell except those set by the CAM cell undergoing the write, read, or compare operation that is the same row or column. Thus, while a first CAM cell (e.g., CAM cell 401) undergoes a write operation, another CAM cell (e.g., the fourth CAM cell 404) is held in a standby state.

A write operation to CAM cell 401 may accomplish one of three tasks: data is written to SRAM cell 301A, data is written to SRAM cell 301B, or data is written to both SRAM cells 301A and 301B simultaneously. Note that the ability to accomplish one of these three tasks depends on the configuration of the CAM cell. Therefore, in one embodiment, a CAM cell sharing a single bit line may not be able to write data to both SRAM cells simultaneously. Each of SRAM cells 301A and 301B holds a single bit. Thus, one of a logic high value and a logic low value may be written to each of SRAM cells 301A and 301B. CAM cell 401 holds two bits (i.e., the values (bits) stored in SRAM cells 301A and 301B). Thus, one of a logic high value, a logic low value, and a logic "don't care" value may be written to CAM cell 401.

To write a data value (e.g., a logic high value) to both SRAM cells 301A and 301B simultaneously, bit line $B_{1A}\#$ and data line $D_1$ are held to a first write data value (e.g., a logic low value) and bit line $B_{1B}$ and data line $D_1\#$ are held to a second write data value (e.g., a logic high value). Control line $C_1$ and match line $MATCH_1$ are held to logic low values. Word lines $WL_1$ and $WL_2$ are pulled up to logic high values to perform the write operation.

Referring to FIGS. 4A and 4B, to prevent the write operation of CAM cell 401 from affecting other CAM cells in the row (e.g., CAM cell 402) or other CAM cells in other rows (e.g., CAM cells 403 and 404), the other CAM cells are held in standby or modified standby states to prevent disturbance of their stored contents. Thus, word lines $WL_2$ and $WL_3$ and data lines $D_2$ and $D_2\#$ are pulled down to logic low values, thereby turning off access transistors 314 and 316, 315 and 317, 320 and 324, and 321 and 325, respectively. As a result, CAM cells in a different row and column (e.g., CAM cell 404) from the CAM cell being written (e.g., CAM cell 401) are isolated from the write operation (e.g., by turned off access transistors 316, 317, 324, and 325). The match line $MATCH_2$ is held to a logic low value to facilitate the latching of data in CAM cells 403 and 404. Bit lines $B_{2A}\#$ and $B_{2B}$ are held to logic high values, thereby applying logic high values to nodes $N_{2A}$ and $N_{2B}$ of CAM cell 402 through turned on transistors 312 and 313, respectively. Because a logic high value applied to an SRAM cell node is typically insufficient to change the value stored by the SRAM cell and access transistors 320 and 321 are turned off, the disturbance of the values stored in CAM cell 402 is prevented. This condition is similar to a read condition for CAM cell 402. Control line $C_2$ is held to a logic high value, thereby applying a logic high value to one or more of nodes $N_{3A}\#$ and $N_{3B}\#$ if any of transistors 322 and 323 are turned on. Because a logic high value applied to an SRAM cell node is typically insufficient to change the value stored by the SRAM cell and access transistors 314 and 315 are turned off, the disturbance of the values stored in CAM cell 403 is prevented.

Returning to FIG. 4A, to write a logic high value to CAM cell 401, bit line $B_{1A}\#$ and data line $D_1$ are held to logic low values (i.e., a first write data value) and bit line $B_{1B}$ and data line $D_1\#$ are held to logic high values (i.e., a second write data value). Under these conditions, the logic high value of word line $WL_1$ turns on transistor 310, the logic high value of data line $D_1\#$ turns on transistor 319, the logic high value of word line $WL_2$ turns on transistor 311, and the logic low value of data line $D_1$ turns off transistor 318. As a result, turned on transistor 310 couples the logic low value of bit line $B_{1A}\#$ to node $N_{1A}\#$, thereby pulling up node $N_{1A}$ to a logic high value through turned on transistor 343. Turned off transistor 318 isolates node $N_{1A}$ from the logic low value of control line $C_1$. Additionally, turned on transistor 319 couples the logic low value of the control line $C_1$ to node $N_{1B}\#$, thereby pulling up node $N_{1B}$ to a logic high value through turned on transistor 345. Note that turned on transistor 311 also pulls up node $N_{1B}$ to a logic high value. As a result, both SRAM cells 301A and 301B store logic high values, thereby storing a logic high value in CAM cell 401.

To write a logic low value to CAM cell 401, bit line $B_{1A}\#$ and $D_1$ are held to logic high values (i.e., a first write data value) and bit line $B_{1B}$ and data line $D_1\#$ are held to logic low values (i.e., a second write data value). Under these conditions, the logic high value of word line $WL_1$ turns on transistor 310, the logic high value of data line $D_1$ turns on transistor 318, the logic high value of word line $WL_2$ turns on transistor 311, and the logic low value of data line $D_1\#$ turns off transistor 319. As a result, turned on transistor 318 couples the logic low value of the control line $C_1$ to node $N_{1A}$, thereby pulling up node $N_{1A}\#$ to a logic high value through turned on transistor 342. Note that turned on transistor 310 also pulls up node $N_{1A}\#$ to a logic high value. Additionally, turned on transistor 311 couples the logic low value of bit line $B_{1B}$ to node $N_{1B}$, thereby pulling up node $N_{1B}\#$ to a logic high value through turned on transistor 344. As a result, both SRAM cell 301A and 301B store logic low values, thereby storing a logic low value in CAM cell 401.

To write a logic "don't care" value to CAM cell 401, bit line $B_{1A}\#$ and data line $D_1$ are held to logic low values (i.e., a first write data value) and similarly bit lines $B_{1B}$ and data line $D_1\#$ are held to logic low values (i.e., a second write data value). Under these conditions, the logic high value of word line $WL_1$ turns on transistor 310, the logic high value of word line $WL_2$ turns on transistor 311, the logic low value of data line $D_1$ turns off transistor 318, and the logic low value of data line $D_1\#$ turns off transistor 319. As a result, turned on transistor 310 couples the logic low value of bit line $B_{1A}\#$ to node $N_{1A}\#$, thereby pulling up node $N_{1A}$ to a logic high value through turned on transistor 343. Turned off transistor 318 isolates node $N_{1A}$ from the logic low value of control line $C_1$. Additionally, turned on transistor 311 couples the logic low value of the bit line $B_{1B}$ to node $N_{1B}$, thereby pulling up node $N_{1B}\#$ to a logic high value through turned on transistor 344. Turned off transistor 319 isolates node $N_{1B}\#$ from the logic low value of control line $C_1$. As a result, SRAM cell 301A stores a logic high value and SRAM cell 301B stores a logic low value, thereby storing a logic "don't care" value in CAM cell 401.

As mentioned above, SRAM cell 301A may be written independent of SRAM cell 301B. To write a first data value to SRAM cell 301A, bit line $B_{1A}\#$ and data line $D_1$ are held to the inverse of the first write data value. Data line $D_1\#$, control line $C_1$, word line $WL_2$, and match line $MATCH_1$ are held to logic low values. Word line $WL_1$ is pulled up to a logic high value to perform the write operation.

To write a logic high value (i.e., a first write data value) to SRAM cell 301A, bit line $B_{1A}\#$ and data line $D_1$ are held to logic low values (i.e., the inverse of the first write data value). Under these conditions, the logic high value of word line $WL_1$ turns on transistor 310 and the logic low value of data line $D_1$ turns off transistor 318. As a result, turned on transistor 310 couples the logic low value of bit line $B_{1A}\#$ to node $N_{1A}\#$, thereby pulling up node $N_{1A}$ to a logic high value through turned on transistor 343. Turned off transistor 318 isolates node $N_{1A}$ from the logic low value of control line $C_1$. Note that the logic low values of word line $WL_2$ and data line $D_1\#$ turn off transistors 311 and 319, respectively. Turned off transistors 311 and 319 isolate SRAM cell 301B, thereby preserving the data previously stored therein. In this way, a logic high value is stored in SRAM cell 301A without disturbing the contents of SRAM cell 301B.

To write a logic low value (i.e., a first write data value) to SRAM cell 301A, bit line $B_{1A}\#$ and data line $D_1$ are held to logic high values (i.e., the inverse of the first write data value). Under these conditions, the logic high value of data line $D_1$ turns on transistor 318 and the logic high value of word line $WL_1$ turns on transistor 310. As a result, turned on transistor 318 couples the logic low value of control line $C_1$ to node $N_{1A}$, thereby pulling up node $N_{1A}\#$ to a logic high value through turned on transistor 342. Node $N_{1A}\#$ is also pulled up to a logic high value through turned on transistor 310. Note that the logic low values of word line $WL_2$ and data line $D_1\#$ turn off transistors 311 and 319, respectively. Turned off transistors 311 and 319 isolate SRAM cell 301B, thereby preserving the data previously stored therein. In this way, a logic low value is stored in SRAM cell 301A without disturbing the contents of SRAM cell 301B.

SRAM cell 301B may be written independent of SRAM cell 301A in a fashion similar to that described for SRAM cell 301A above. To write a first data value to SRAM cell 301B, bit line $B_{1B}$ and data line $D_1\#$ are held to the first write data value. Data line $D_1$, control line $C_1$, word line $WL_1$, and match line $MATCH_1$ are held to logic low values. word line $WL_2$ is pulled up to a logic high value to perform the write operation.

To write a logic high value (i.e., a first data value) to SRAM cell 301B, bit line $B_{1B}$ and data line $D_1\#$ are held to logic high values (i.e., the first write data value). Under these conditions, the logic high value of word line $WL_2$ turns on transistor 311 and the logic high value of data line $D_1\#$ turns on transistor 319. As a result, turned on transistor 319 couples the logic low value of control line $C_1$ to node $N_{1B}\#$, thereby pulling up node $N_{1B}$ to a logic high value through turned on transistor 345. Node $N_{1B}$ is also pulled up to a logic high value through turned on transistor 311. Note that the logic low values of word line $WL_1$ and data line $D_1$ turn off transistors 310 and 318, respectively. Turned off transistors 310 and 318 isolate SRAM cell 301A, thereby preserving the data previously stored therein. In this way, a logic high value is stored within SRAM cell 301B without disturbing the contents of SRAM cell 301A.

To write a logic low value (i.e., a first data value) to SRAM cell 301B, bit line $B_{1B}$ and data line $D_1\#$ are held to logic low values (i.e., the first write data value). Under these conditions, the logic low value of data line $D_1\#$ turns off transistor 319 and the logic high value of word line $WL_2$ turns on transistor 311. As a result, turned on transistor 311 couples the logic low value of bit line $B_{1B}$ to node $N_{1B}$, thereby pulling up node $N_{1B}\#$ to a logic high value through turned on transistor 344. Note that the logic low values of word line $WL_1$ and data line $D_1$ turn off transistors 310 and 318, respectively. Turned off transistors 310 and 318 isolate SRAM cell 301A, thereby preserving the data previously stored therein. In this way, a logic low value is stored in SRAM cell 301B without disturbing the contents of SRAM cell 301A.

A read operation from CAM cell 401 may accomplish one of three tasks: data is read from SRAM cell 301A, data is read from SRAM cell 301B, or data is read from both SRAM cells 301A and 301B simultaneously. As described above, because SRAM cells 301A and 301B each hold a single bit, one of a logic high value and a logic low value may be read from each of SRAM cells 301A and 301B. Similarly, because CAM cell 401 holds two bits, one of a logic high value, a logic low value, and a logic "don't care" value may be read from CAM cell 401. To read a data value from both SRAM cells 301A and 301B simultaneously (i.e., to read a data value from CAM cell 401), both bit lines $B_{1A}\#$ and $B_{1B}$ are pre-charged to a logic high value. Data lines $D_1$ and $D_1\#$ and match line $MATCH_1$ are held to logic low values. The value of control line $C_1$ does not matter and is therefore left in it's previous state. Word lines $WL_1$ and $WL_2$ are pulled up to logic high values to perform the read operation.

During a read operation from CAM cell 401, the logic high value of word line $WL_1$ turns on transistor 310, thereby coupling the pre-charged logic high value of bit line $B_{1A}\#$ to node $N_{1A}\#$. As a result, a logic low value stored at node $N_{1A}\#$ pulls down bit line $B_{1A}\#$ to a logic low value and a logic high value stored at node $N_{1A}\#$ causes bit line $B_{1A}\#$ to remain at a logic high value. Because bit line $B_{1A}\#$ is coupled to the inverted storage node of SRAM cell 301A (i.e., node $N_{1A}\#$), bit line $B_{1A}\#$ is an inverted value bit line. Thus, the data read from bit line $B_{1A}\#$ (i.e., the data value stored at node $N_{1A}\#$) is the opposite value of the data value stored in SRAM cell 301A (i.e., the data value stored at node $N_{1A}$). Similarly, in reading from SRAM cell 301B, the logic high value of word line $WL_2$ turns on transistor 311, thereby coupling the pre-charged logic high value of bit line $B_{1B}$ to node $N_{1B}$. As a result, a logic low value stored at node NIB pulls down bit line $B_{1B}$ to a logic low value and a logic high value stored at node $N_{1B}$ causes bit line $B_{1B}$ to remain at a logic high value. Because bit line $B_{1B}$ is coupled to the storage node of SRAM cell 301B (i.e., node $N_{1B}$), the data read from bit line $B_{1B}$ is the value of the data value stored in SRAM cell 301B (i.e., the data value stored at node $N_{1B}$).

For example, if CAM cell 401 stores a logic high value, then nodes $N_{1A}$ and $N_{1B}$ store logic high values and nodes $N_{1A}\#$ and $N_{1B}\#$ store logic low values. Under these conditions, a read operation results in bit line $B_{1A}\#$ having a logic low value and bit line $B_{1B}$ having a logic high value. As a result, the data read from CAM cell 401 is interpreted as a logic high value stored in SRAM cell 301B (i.e., the value read from bit line $B_{1B}$) and a logic high value stored in SRAM cell 301A (i.e., the opposite of the value read from bit line $B_{1A}\#$). Therefore, a logic high value is read from CAM cell 401.

As mentioned above, SRAM cell 301A may be read independent of SRAM cell 301B. To read a first data value from SRAM cell 301A, bit line $B_{1A}\#$ is pre-charged to a logic high value. Data line $D_1$, data line $D_1\#$, word line $WL_2$, and match line $MATCH_1$ are held to logic low values. The values of bit line $B_{1B}$ and control line $C_1$ do not matter, and so are preferentially left in their last states. Word line $WL_1$ is pulled up to a logic high value to perform the read operation.

The logic high value of word line $WL_1$ turns on transistor 310, thereby coupling the pre-charged logic high value of bit line $B_{1A}\#$ to node $N_{1A}\#$. As a result, a logic low value stored at node $N_{1A}\#$ pulls down bit line $B_{1A}\#$ to a logic low value and a logic high value stored at node $N_{1A}\#$ causes bit line $B_{1A}\#$ to remain at a logic high value. As described above, because bit line $B_{1A}\#$ is coupled to the inverted storage node of SRAM cell 301A (i.e., node $N_{1A}\#$), bit line $B_{1A}\#$ is an inverted value bit line. Thus, the data read from bit line $B_{1A}\#$ (i.e., the data value stored at node $N_{1A}\#$) is the opposite value of the data value stored in SRAM cell 301A (i.e., the data value stored at node $N_{1A}$). The logic low values of data line $D_1\#$ and word line $WL_2$ turn off transistors 319 and 311, respectively, thereby isolating SRAM cell 301B from the read operation.

Similarly, SRAM cell 301B may be read independent of SRAM cell 301A. To read a first data value from SRAM cell 301B, bit line $B_1B$ is pre-charged to a logic high value. Data line $D_1$, data line $D_1\#$, word line $WL_1$, and match line $MATCH_1$ are held to logic low values. The values of bit line $B_{1B}\#$ and control line $C_1$ do not matter, and so are preferentially left in their last states. Word line $WL_2$ is pulled up to a logic high value to perform the read operation.

The logic high value of word line $WL_2$ turns on transistor 311, thereby coupling the pre-charged logic high value of bit line $B_{1B}$ to node $N_{1B}$. As a result, a logic low value stored at node NIB pulls down bit line $B_{1B}$ to a logic low value and a logic high value stored at node $N_{1B}$ causes bit line $B_{1B}$ to remain at a logic high value. As described above, the data read from bit line $B_{1B}$ is the value of the data value stored in SRAM cell 301B (i.e., the data value stored at node $N_1B$). The logic low values of data line $D_1$ and word line $WL_1$ turn off transistors 318 and 310, respectively, thereby isolating SRAM cell 301A from the read operation.

A compare operation from CAM cell 401 may accomplish one of three tasks: applied data is compared to SRAM cell 301A, applied data is compared to SRAM cell 301B, or applied data is compared to both SRAM cells 301A and 301B simultaneously. As described above, because SRAM cells 301A and 301B each hold a single bit, only a single bit (i.e., a logic high or a logic low value) may be compared to each of SRAM cells 301A and 301B. Similarly, because CAM cell 401 holds two bits, one of a logic high value, a logic low value, and a logic "don't care" value may be compared to the data stored in CAM cell 401. To compare a data value to both SRAM cells 301A and 301B simultaneously (i.e., to compare a data value to CAM cell 301), match line $MATCH_1$ is pre-charged to a logic low value. Control line $C_1$ is held to a logic high value, and word lines $WL_1$ and $WL_2$ are held to logic low values. The value of bit lines $B_{1B}$ and $B_{1A}\#$ do not matter and are therefore left in their previous states. A compare data value is applied to data lines $D_1$ and $D_1\#$ to perform the compare operation.

To compare a logic high compare data value to CAM cell 401, data line $D_1$ is held to a logic high value and data line $D_1\#$ is held to a logic low value. Under these conditions, the logic low value of data line $D_1\#$ turns off transistor 319, thereby de-coupling the logic high value of control line $C_1$ from node $N_{1B}\#$. Thus, the logic value stored in SRAM cell 301B does not affect the value of match line $MATCH_1$ during the compare operation. The logic high value of data line $D_1$ turns on transistor 318, thereby coupling the logic high value of control line $C_1$ to node $N_{1A}$. If CAM cell 401 stores a matching logic high value (SRAM cell 301A node $N_{1A}$ stores a logic high value and node $N_{1A}\#$ stores a logic low value), then node $N_{1A}$ is de-coupled from match line $MATCH_1$ due to turned off transistor 327. As a result, match line $MATCH_1$ remains in a logic low state, thereby indicating a match condition. Similarly, if CAM cell 401 stores a logic "don't care" value (SRAM cell 301A node $N_{1A}$ stores a logic high value and node $N_{1A}\#$ stores a logic low value), then match line $MATCH_1$ similarly remains in a logic low state, thereby indicating a match condition. If CAM cell 401 stores a non-matching logic low value (SRAM cell 301A node $N_{1A}$ stores a logic low value and node $N_{1A}\#$ stores a logic high value), then node $N_{1A}$ is coupled to match line $MATCH_1$ through turned on transistor 327. As a result, match line $MATCH_1$ is pulled up to the logic high value of control line $C_1$ through turned on transistors 318 and 327, thereby indicating a no-match condition.

To compare a logic low compare data value to CAM cell 401, data line $D_1$ is held to a logic low value and data line $D_1\#$ is held to a logic high value. Under these conditions, the logic low value of data line $D_1$ turns off transistor 318, thereby de-coupling the logic high value of control line $C_1$ from node $N_{1A}$. Thus, the logic value stored in SRAM cell 301A does not affect the value of match line $MATCH_1$ during the compare operation. The logic high value of data line $D_1\#$ turns on transistor 319, thereby coupling the logic high value of control line $C_1$ to node $N_{1B}\#$. If CAM cell 401 stores a matching logic low value (SRAM cell 301B node $N_{1B}$ stores a logic low value and node $N_{1B}\#$ stores a logic high value), then node $N_{1B}\#$ is deoupled coupled from match line $MATCH_1$ due to turned off transistor 328. As a result, match line $MATCH_1$ remains in a logic low state, thereby indicating a match condition. Similarly, if CAM cell 401 stores a logic "don't care" value (SRAM cell 301B node NIB stores a logic low value and node $N_{1B}\#$ stores a logic high value), then match line $MATCH_1$ similarly remains in a logic low state, thereby indicating a match condition. If CAM cell 401 stores a non-matching logic high value (SRAM cell 301B node $N_{1B}$ stores a logic high value and node $N_{1B}\#$ stores a logic low value), then node $N_{1B}\#$ is coupled to match line $MATCH_1$ through turned on transistor 328. As a result, match line $MATCH_1$ is pulled up to the logic high value of control line $C_1$ through turned on transistors 319 and 328, thereby indicating a no-match condition.

To compare a logic "don't care" compare data value to CAM cell 401, data lines $D_1$ and $D_1\#$ are held to logic low values. Under these conditions, the logic low values of data lines $D_1$ and $D_1\#$ turn off transistors 318 and 319, respectively, thereby de-coupling the logic high value of control line $C_1$ from nodes $N_{1A}$ and $N_{1B}\#$. Thus, the logic values stored in SRAM cells 301A and 3101B do not affect the value of match line $MATCH_1$ during the compare operation. As a result, match line $MATCH_1$ remains at a logic high value, thereby indicating a match condition for all values stored in CAM cell 401.

As mentioned above, SRAM cell 301A may be compared to a data value independent of SRAM cell 301B. To compare a first data value to SRAM cell 301A, match line $MATCH_1$ is brought to a logic low value. Control line $C_1$ is held to a logic high value, and word lines $WL_1$ and $WL_2$ and data line $D_1\#$ are held to logic low values. The value of bit lines $B_{1B}$ and $B_{1A}\#$ do not matter and are therefore left in their previous states. A compare data value is applied to data line $D_1$ to perform the compare operation. The logic low values of word line $WL_2$ and data line $D_1\#$ isolate SRAM cell 301B from the compare operation. The compare operation is then carried out similarly to that described above with respect to a comparison operation on CAM cell 401.

Similarly, SRAM cell 301B may be compared to a data value independent of SRAM cell 301A. To compare a first data value to SRAM cell 301B, match line $MATCH_1$ is brought to a logic low value. Control line $C_1$ is held to a logic high value, and word lines $WL_1$ and $WL_2$ and data line $D_1$ are held to logic low values. The value of bit lines $B_{1B}$ and $B_{1A}\#$ do not matter and are therefore left in their previous states. A data value equivalent to the inverted compare data value is applied to data line $D_1\#$ to perform the compare operation. The logic low values of word line $WL_2$ and data line $D_1$ isolate SRAM cell 301A from the compare operation. The compare operation is then carried out similarly to that described above with respect to a comparison operation on CAM cell 401.

Operations similar to those described above may be performed on a row of CAM cells by applying the techniques described with respect to CAM cell 401 to the other CAM cells in the row. A comparison operation in CAM cell 401 (and similarly in CAM array 400(1)) results in a logic low value of the match line $MATCH_1$ if the applied comparison data value matches the data value stored in CAM cell 401, and results in a logic high value of the match line $MATCH_1$ if the applied comparison data value does not match the data value stored in CAM cell 401. It is also beneficial to have a CAM cell which results in a logic high value of the match line for a match condition and results in a logic low value of the match line for a no-match condition.

Figure 4C:
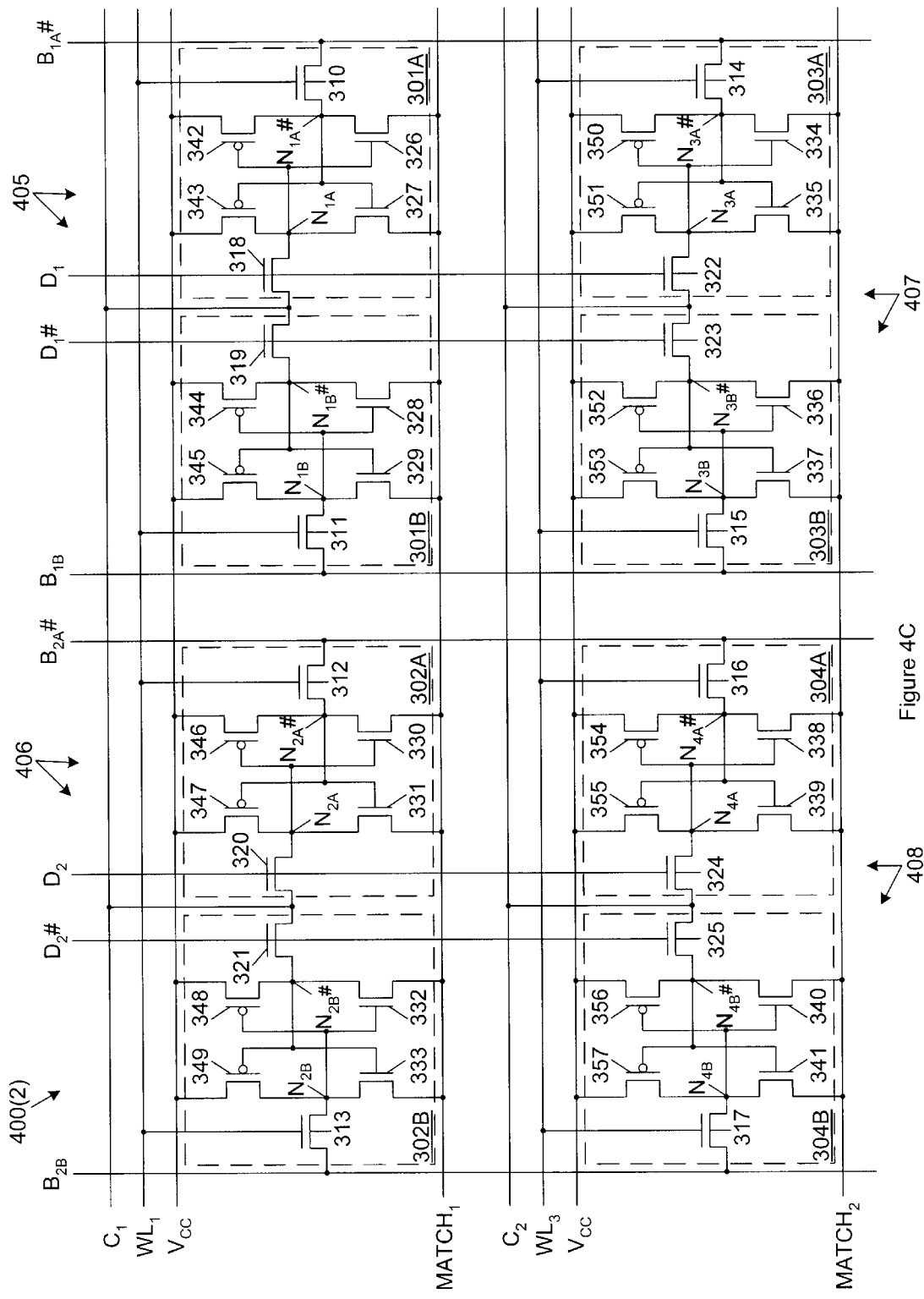
FIG. 4C is a schematic diagram of a CAM array in accordance with another embodiment of the present invention.

FIG. 4C is a schematic diagram of ternary CAM array 400(2) in accordance with another embodiment of the present invention. Similar elements between CAM arrays 400(2) and 400(1) (FIG. 4A) are labeled similarly. Thus, CAM array 400(2) includes SRAM cells 301A–304A and 301B–304B which are coupled to bit lines $B_{1B}$, $B_{1A}\#$, $B_{2B}$, and $B_{2A}\#$, data lines $D_1$, $D_1\#$, $D_2$, and $D_2\#$, control lines $C_1$ and $C_2$, word lines $WL_1$, and $WL_3$, the $V_{CC}$ voltage supply source, and match lines $MATCH_1$ and $MATCH_2$. Note that word lines $WL_1$ and $WL_2$ (FIG. 4A) are combined into one word line $WL_1$ (FIG. 4C) and word lines $WL_3$ and $WL_4$ (FIG. 4A) are combined into one word line $WL_3$ (FIG. 4C). As a result, the gates of transistors 310–313 are held to the same voltage (i.e., the voltage level of word line $WL_1$) and the gates of transistors 314–317 are held to the same voltage (i.e., the voltage level of word line $WL_3$). Thus, for example, when the voltage on bit line $B_{1A}\#$ is being applied to node $N_{1A}\#$ through turned on transistor 310, then the voltage on bit line $B_{1B}$ is simultaneously being applied to node $N_{1B}$ through turned on transistor 311. The benefit of the single word line for a row of CAM cells is smaller cells size. CAM array 400(2) operates similarly to CAM array 400(1).

Figure 4D:
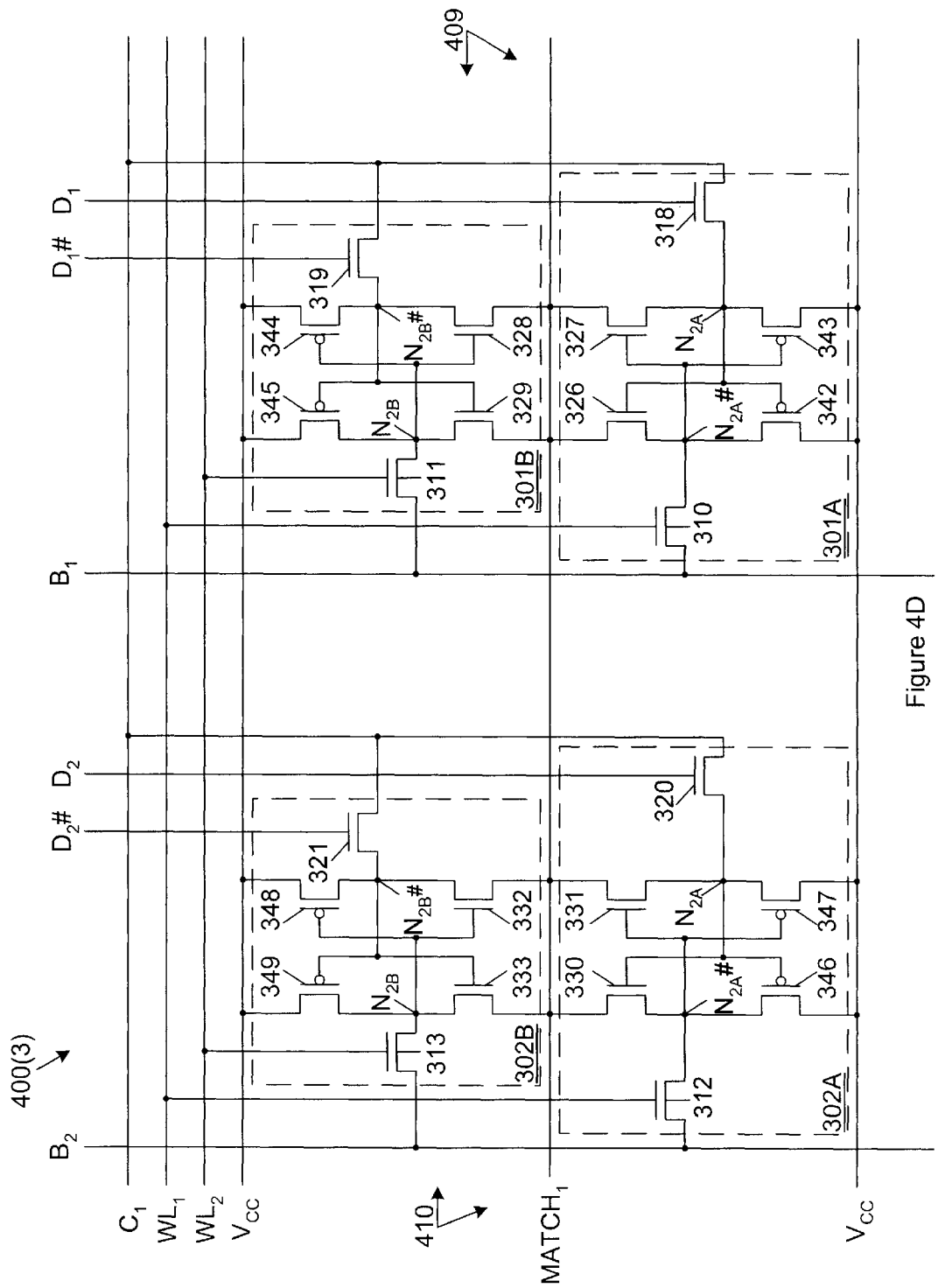
FIG. 4D is a schematic diagram of a CAM array in accordance with another embodiment of the present invention.

FIG. 4D is a schematic diagram of ternary CAM array 400(3) in accordance with another embodiment of the present invention. Similar elements between CAM arrays 400(3) and 400(1) (FIG. 4A) are labeled similarly. Thus, CAM array 400(3) includes SRAM cells 301A–302A and 301B–302B which are coupled to bit lines $B_1$ and $B_2$, data lines $D_1$, $D_1\#$, $D_2$, and $D_2\#$, control line $C_1$, word lines $WL_1$, and $WL_2$, the $V_{CC}$ voltage supply source, and match line $MATCH_1$. SRAM cells 301A and 301B form CAM cell 409 and SRAM cells 302A and 302B form CAM cell 410. Note that bit lines $B_{1A}\#$ and $B_{1B}$ (FIG. 4A) are combined into one bit line $B_1$ (FIG. 4C) and bit lines $B_{2A}\#$ and $B_{2B}$ (FIG. 4A) are combined into one bit line $B_2$ (FIG. 4C). As a result, a terminal of each of transistors 310 and 311 is held to the same voltage (i.e., the voltage level of bit line $B_1$) and a terminal of each of transistors 313 and 314 is held to the same voltage (i.e., the voltage level of bit line $B_2$). As a result, SRAM cells 301A and 301B may not be written with different data values simultaneously. However, the single bit line allows a smaller array size. CAM array 400(3) operates similarly to CAM array 400(1).

Second Embodiment: 13-T Ternary CAM Cell

Figure 5A:
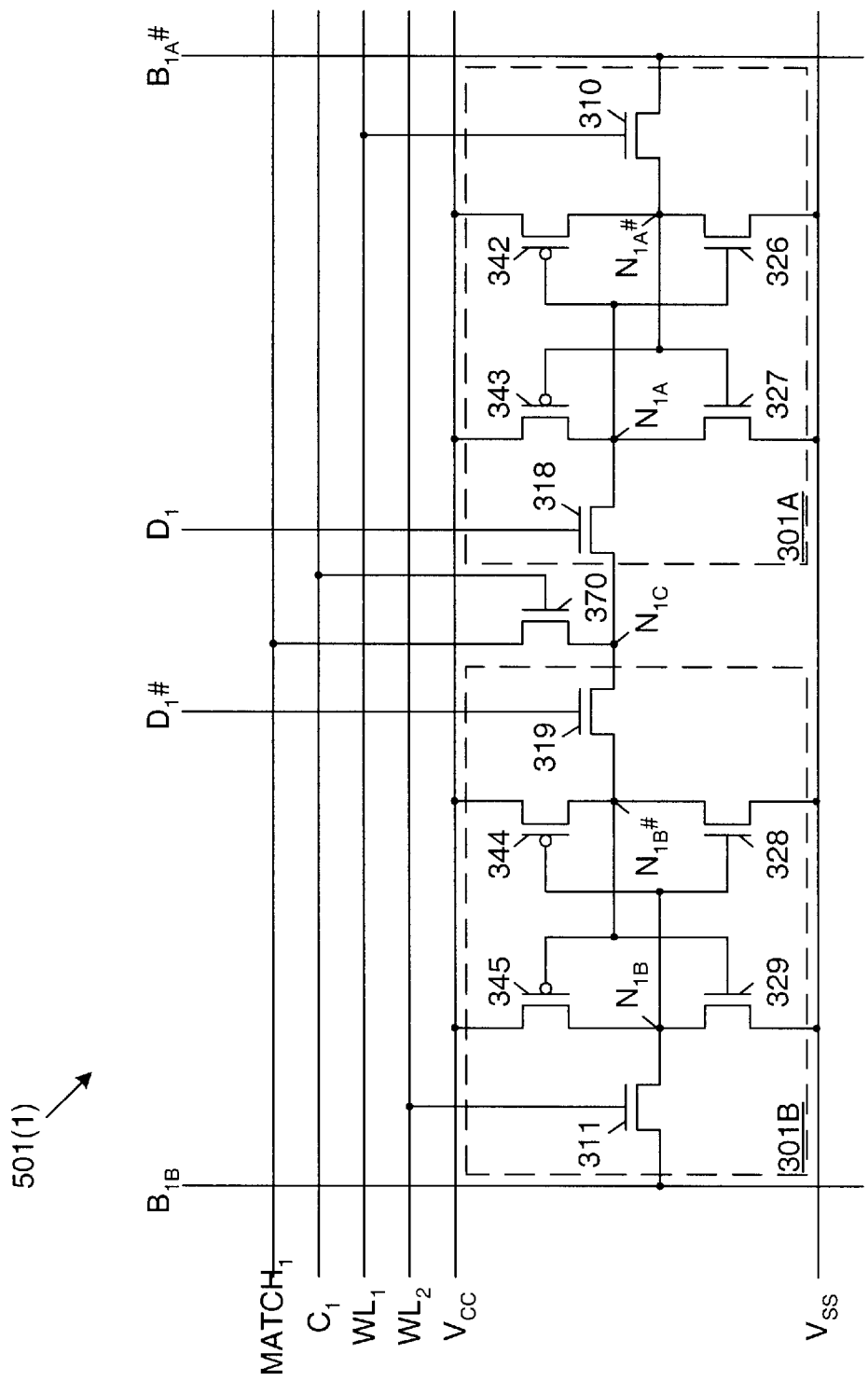
FIG. 5A is a schematic diagram of another ternary CAM cell in accordance with an embodiment of the present invention.

FIG. 5A is a schematic diagram of ternary CAM cell 501(1) in accordance with another embodiment of the present invention. Similar elements between CAM cells 501(1) and 401 (FIG. 4B) are labeled similarly. Thus, CAM cell 501(1) includes SRAM cells 301A and 301B and n-channel transistor 370. CAM cell 501(1) is coupled to bit lines $B_{1B}$ and $B_{1A}\#$, data lines $D_1$ and $D_1\#$, control line $C_1$, word lines $WL_1$ and $WL_2$, the $V_{CC}$ voltage supply source, match line $MATCH_1$, and the $V_{SS}$ voltage supply source as described below. A no-match condition in CAM cell 501(1) occurs when match line $MATCH_1$ is pulled to a logic low value as described below.

CAM cell 501(1) includes SRAM cells 301A and 301B. Transistor 310 is coupled as an access transistor between bit line $B_{1A}\#$ and node $N_{1A}\#$. The gate of transistor 310 is coupled to word line $WL_1$. Transistor 318 is coupled as an access transistor between node $N_{1C}$ and node $N_{1A}$. The gate of transistor 318 is coupled to data line $D_1$. SRAM cell 301A is coupled between the $V_{CC}$ power supply source (e.g., at terminals of transistors 342 and 343) and the $V_{SS}$ power supply source (e.g., at terminals of transistors 326 and 327). Transistor 311 is coupled as an access transistor between bit line $B_{1B}$ and node $N_{1B}$. The gate of transistor 311 is coupled to word line $WL_2$. Transistor 319 is coupled as an access transistor between node $N_{1C}$ and node $N_{1B}\#$. The gate of transistor 319 is coupled to data line $D_1\#$. SRAM cell 301B is coupled between the $V_{CC}$ power supply source (e.g., at terminals of transistors 344 and 345) and the $V_{SS}$ power supply source (e.g., at terminals of transistors 328 and 329). Transistor 370 is coupled between match line $MATCH_1$ and node $N_{1C}$. Transistor 370 has a gate coupled to control line $C_1$.

The operation of CAM cell 501(1) is similar to that of CAM cell 401, and will now be described. In a standby state, word lines $WL_1$ and $WL_2$ and data lines $D_1$ and $D_1\#$ are pulled down to logic low values, thereby turning off access transistors 310, 311, 318, and 319, respectively. Match line $MATCH_1$ is held to a logic low value and the value of control line $C_1$ does not matter but is preferentially left in it's last state. Under these conditions, SRAM cells 301A and 301B latch the values at nodes $N_{1A}$ and $N_{1B}$ (and the inverted values $N_{1A}\#$ and $N_{1B}\#$), respectively.

Similarly to that described for CAM cell 401 (FIG. 4B), a write operation to CAM cell 501(1) may accomplish one of three tasks: data is written to SRAM cell 301A, data is written to SRAM cell 301B, or data is written to both SRAM cells 301A and 301B simultaneously. Because each of SRAM cells 301A and 301B hold a single bit, one of a logic high value and a logic low value may be written to each of SRAM cells 301A and 301B. Because CAM cell 501(1) holds two bits (i.e., the values stored in SRAM cells 301A and 301B), one of a logic high value, a logic low value, and a logic "don't care" value may be written to CAM cell 501(1). To write a data value to CAM cell 501(1), bit line $B_{1A}\#$ and data line $D_1$ are held to a first write data value and bit line $B_{1B}$ and data line $D_1\#$ are held to a second write data value. Control line $C_1$ is held to a logic high value. Match line $MATCH_1$ is held to a logic low value, thereby coupling the logic low value of match line $MATCH_1$ to node $N_{1C}$ through turned on transistor 370. Word lines $WL_1$ and $WL_2$ are pulled up to logic high values to perform the write operation.

Write operations for logic high values, logic low values, and logic "don't care" values are performed similarly to those of CAM cell 401 described above.

SRAM cell 301A may be written independently of SRAM cell 301B. To write a first data value to SRAM cell 301A, bit line $B_{1A}\#$ and data line $D_1$ are held to the inverse of the first write data value. Data line $D_1\#$, word line $WL_2$, and match line $MATCH_1$ are held to logic low values. Control line $C_1$ is held to a logic high value, thereby coupling the logic low value of match line $MATCH_1$ to node $N_{1C}$. Word line $WL_1$ is pulled up to a logic high value to perform the write operation. Under these conditions, a write operation to SRAM cell 301A is performed similarly to the write operation of SRAM cell 301A in FIG. 4B.

SRAM cell 301B may be written independently of SRAM cell 301A in a fashion similar to that described for SRAM cell 301A above. To write a first data value to SRAM cell 301B, bit line $B_{1B}$ and data line $D_1\#$ are held to the first write data value. Data line $D_1$, word line $WL_1$, and match line $MATCH_1$ are held to logic low values. Control line $C_1$ is held to a logic high value, thereby coupling the logic low value of the match line $MATCH_1$ to node $N_{1C}$. Word line $WL_2$ is pulled up to a logic high value to perform the write operation. Under these conditions, a write operation to SRAM cell 301B is performed similarly to the write operation of SRAM cell 301B (FIG. 4B).

To read a data value from both SRAM cells 301A and 301B simultaneously (i.e., to read a data value from CAM cell 501(1)), bit lines $B_{1A}\#$ and $B_{1B}$ are both pre-charged to a logic high value. Data lines $D_1$ and $D_1\#$ are held to logic low values. The values of control line $C_1$ and match line $MATCH_1$ do not matter and are therefore left in their previous states. Word lines $WL_1$ and $WL_2$ are pulled up to logic high values to perform the read operation. Read operations for logic high values, logic low values, and logic "don't care" values are then performed similarly to those of CAM cell 401 described above.

SRAM cell 301A may be read independently of SRAM cell 301B. To read a first data value from SRAM cell 301A, bit line $B_{1A}\#$ is pre-charged to a logic high value. Data line $D_1$, data line $D_1\#$ and word line $WL_2$ are held to logic low values. The values of bit line $B_{1B}$, match line $MATCH_1$, and control line $C_1$ do not matter, and so are preferentially left in their last state. Word line $WL_1$ is pulled up to a logic high value to perform the read operation. Read operations for logic high values and logic low values are then performed similarly to those of SRAM cell 301A (FIG. 4B) described above.

Similarly, SRAM cell 301B may be read independently of SRAM cell 301A. To read a first data value from SRAM cell 301B, bit line $B_{1B}$ is pre-charged to a logic high value. Data line $D_1$, data line $D_1\#$, and word line $WL_1$ are held to logic low values. The values of bit line $B_{1B}\#$, match line $MATCH_1$, and control line $C_1$ do not matter, and so are preferentially left in their last state. Word line $WL_2$ is pulled up to a logic high value to perform the read operation. Read operations for logic high values and logic low values are then performed similarly to those of SRAM cell 301B described above.

A compare operation from CAM cell 501(1) may accomplish one of three tasks: applied data is compared to SRAM cell 301A, applied data is compared to SRAM cell 301B, or applied data is compared to both SRAM cells 301A and 301B simultaneously. Because SRAM cells 301A and 301B each hold a single bit, only a single bit (i.e., a logic high or a logic low value) may be compared to each of SRAM cells 301A and 301B. Similarly, because CAM cell 501(1) holds two bits, one of a logic high value, a logic low value, and a logic "don't care" value may be compared to the data stored in CAM cell 501(1). To compare a data value to CAM cell 501(1), match line $MATCH_1$ is pre-charged to a logic high value. Word lines $WL_1$ and $WL_2$ are held to logic low values. Control line $C_1$ is held to a logic high value, thereby coupling the pre-charged logic high value of match line $MATCH_1$ to node $N_{1C}$. The value of bit lines $B_{1B}$ and $B_{1A}\#$ do not matter and are therefore left in their previous states. A compare data value is applied to data lines $D_1$ and $D_1\#$ to perform the compare operation.

To compare a logic high compare data value to CAM cell 501(1), data line $D_1$ is held to a logic high value and data line $D_1\#$ is held to a logic low value. Under these conditions, the logic low value of data line $D_1\#$ turns off transistor 319, thereby de-coupling the pre-charged logic high value at node $N_{1C}$ from node $N_{1B}\#$. Thus, the logic value stored in SRAM cell 301B does not affect the prearged charged logic high value of match line $MATCH_1$ during the compare operation. The logic high value of data line $D_1$ turns on transistor 318, thereby coupling the pre-charged logic high value at node $N_{1C}$ to node $N_{1A}$. If CAM cell 501(1) stores a matching logic high value (SRAM cell 301A node $N_{1A}$ stores a logic high value and node $N_{1A}\#$ stores a logic low value), then node $N_{1A}$ is de-coupled from the $V_{SS}$ voltage supply source due to turned off transistor 327. As a result, match line $MATCH_1$ remains in a logic high state, thereby indicating a match condition. Similarly, if CAM cell 501(1) stores a logic "don't care" value (SRAM cell 301A node $N_{1A}$ stores a logic high value and node $N_{1A}\#$ stores a logic low value), then match line $MATCH_1$ similarly remains in a logic high state, thereby indicating a match condition. If CAM cell 501(1) stores a non-matching logic low value (SRAM cell 301A node $N_{1A}$ stores a logic low value and node $N_{1A}\#$ stores a logic high value), then node $N_{1A}$ is coupled to the $V_{SS}$ voltage supply source through turned on transistor 327. As a result, match line $MATCH_1$ is pulled down to the logic low value through turned on transistors 318, 327, and 370, thereby indicating a no-match condition.

To compare a logic low compare data value to CAM cell 501(1), data line $D_1$ is held to a logic low value and data line $D_1\#$ is held to a logic high value. Under these conditions, the logic low value of data line $D_1$ turns off transistor 318, thereby de-coupling the pre-charged logic high value at node $N_{1C}$ from node $N_{1A}$. Thus, the logic value stored in SRAM cell 301A does not affect the value of match line $MATCH_1$ during the compare operation. The logic high value of data line $D_1\#$ turns on transistor 319, thereby coupling the pre-charged logic high value at node $N_{1C}$ to node $N_{1B}\#$. If CAM cell 501(1) stores a matching logic low value (i.e., SRAM cell 301B node $N_{1B}$ stores a logic low value and node $N_{1B}\#$ stores a logic high value), then node $N_{1B}\#$ is de-coupled from the $V_{SS}$ voltage supply source due to turned off transistor 328. As a result, match line $MATCH_1$ remains in a logic high state, thereby indicating a match condition. Similarly, if CAM cell 501(1) stores a logic "don't care" value (SRAM cell 301B node $N_{1B}$ stores a logic low value and node $N_{1B}\#$ stores a logic high value), then match line $MATCH_1$ similarly remains in a logic high state, thereby indicating a match condition. If CAM cell 501(1) stores a non-matching logic high value (SRAM cell 301B node $N_{1B}$ stores a logic high value and node $N_{1B}\#$ stores a logic low value), then node $N_{1B}\#$ is coupled to the $V_{SS}$ voltage supply source through turned on transistor 328. As a result, match line MATCH$_1$ is pulled down to a logic low value through turned on transistors 319, 328, and 370, thereby indicating a no-match condition.

To compare a logic "don't care" compare data value to CAM cell 501(1), data lines D$_1$ and D$_1$# are held to logic low values. Under these conditions, the logic low values of data lines D$_1$ and D$_1$# turn off transistors 318 and 319, respectively, thereby de-coupling the pre-charged logic high value of match line MATCH$_1$ from nodes N$_{1A}$ and N$_{1B}$#. Thus, the logic values stored in SRAM cells 301A and 301B do not affect the value of match line MATCH$_1$ during the compare operation. As a result, match line MATCH$_1$ remains at a logic high value, thereby indicating a match condition for all logic values stored in CAM cell 501.

SRAM cell 301A may be compared to a data value independent of SRAM cell 301B. To compare a first data value to SRAM cell 301A, match line MATCH$_1$ is pre-charged to a logic high value. Control line C$_1$ is held to a logic high value, thereby coupling the pre-charged logic high value of match line MATCH$_1$ to node N$_{1C}$. Word lines WL$_1$ and WL$_2$ and data line D$_1$# are held to logic low values. The value of bit lines B$_{1B}$ and B$_{1A}$# do not matter and are therefore left in their previous states. A compare data value is applied to data line D$_1$ to perform the compare operation. The logic low values of word line WL$_2$ and data line D$_1$# isolate CAM cell 301B from the compare operation. The compare operation is then carried out similarly to that described above with respect to a comparison operation on CAM cell 501(1).

Similarly, SRAM cell 301B may be compared to a data value independent of SRAM cell 301A. To compare a compare data value to SRAM cell 301B, match line MATCH$_1$ is pre-charged to a logic high value. Control line C$_1$ is held to a logic high value, thereby coupling the pre-charged value of match line MATCH$_1$ to node N$_{1C}$. Word lines WL$_1$ and WL$_2$ and data line D$_1$ are held to logic low values. The value of bit lines B$_{1B}$ and B$_{1A}$# do not matter and are therefore left in their previous states. A data value equivalent to the inverted compare data value is applied to data line D$_1$# to perform the compare operation. The logic low values of word line WL$_2$ and data line D$_1$ isolate CAM cell 301A from the compare operation. The compare operation is then carried out similarly to that described above with respect to a comparison operation on CAM cell 501(1).

In this manner, the beneficial result of having a CAM cell which results in a logic high value of the match line for a match condition and results in a logic low value of the match line for a no-match condition is achieved while maintaining a small CAM cell size.

Note that variations of CAM cell 501(1) are possible, such as a variation combining word lines WL$_1$ and WL$_2$ and a variation combining bit lines B$_{1A}$# and B$_{1B}$.

Figure 5B:
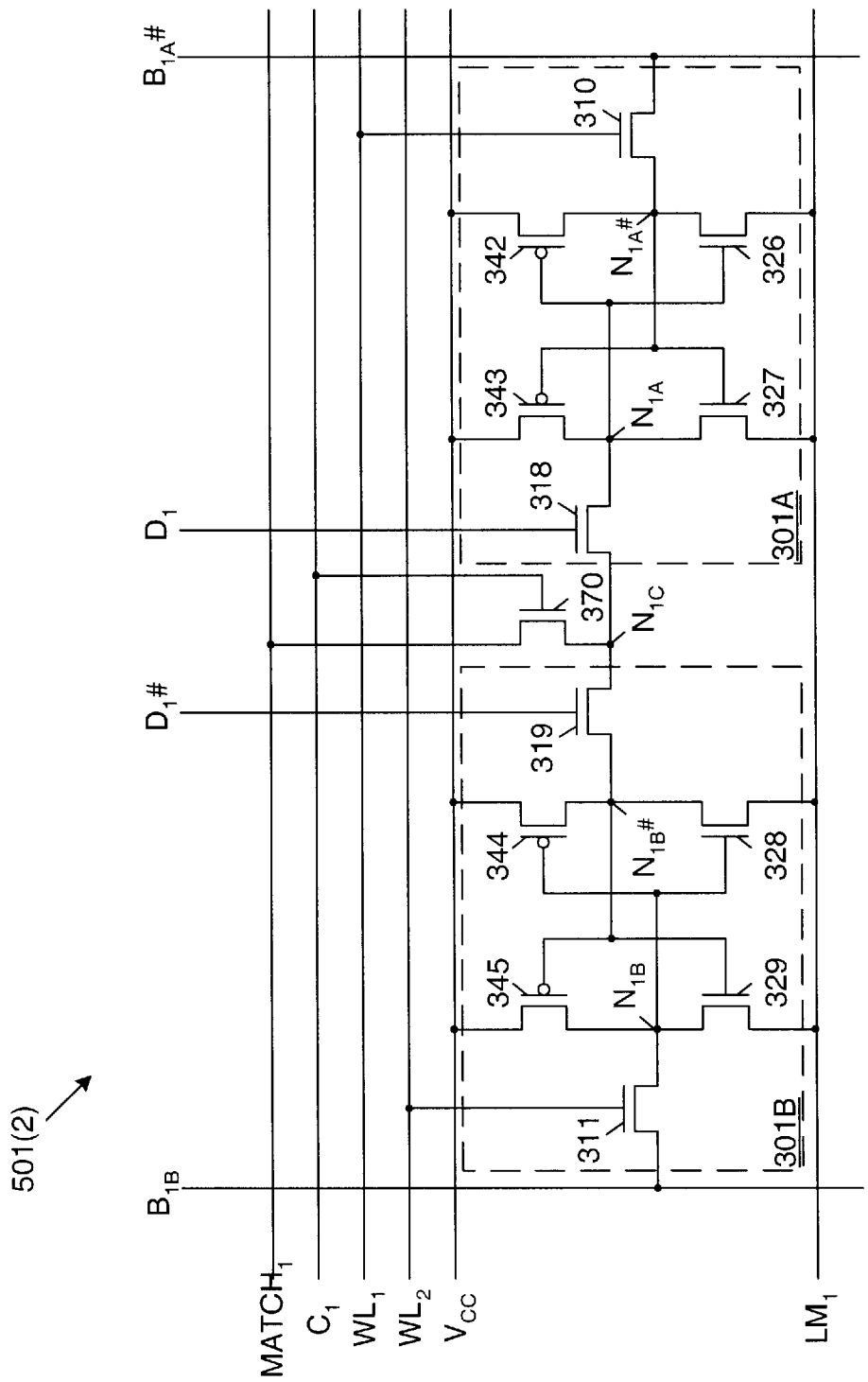
FIG. 5B is a schematic diagram of another ternary CAM cell in accordance with another embodiment of the present invention.

FIG. 5B is a schematic diagram of ternary CAM cell 501(2) in accordance with a variation of the present embodiment. Similar elements between CAM cells 501(1) (FIG. 5A) and 501(2) are labeled similarly. Thus, CAM cell 501(2) includes n-channel transistors 310, 311, 318, 319, 326–329, and 370 and p-channel transistors 342–345. In contrast to CAM cell 501(1), transistors 326–329 of CAM cell 501(2) have terminals coupled to low match line LM$_1$.

CAM cell 501(2) functions similarly to CAM cell 501(1). However, the use of low match line LM$_1$ enables a beneficial power savings in CAM cell 501(2), for example, during a standby condition when low match line LM$_1$ is allowed to float above a grounding voltage.

Third Embodiment: 14-T Ternary CAM Cell

Figure 6A:
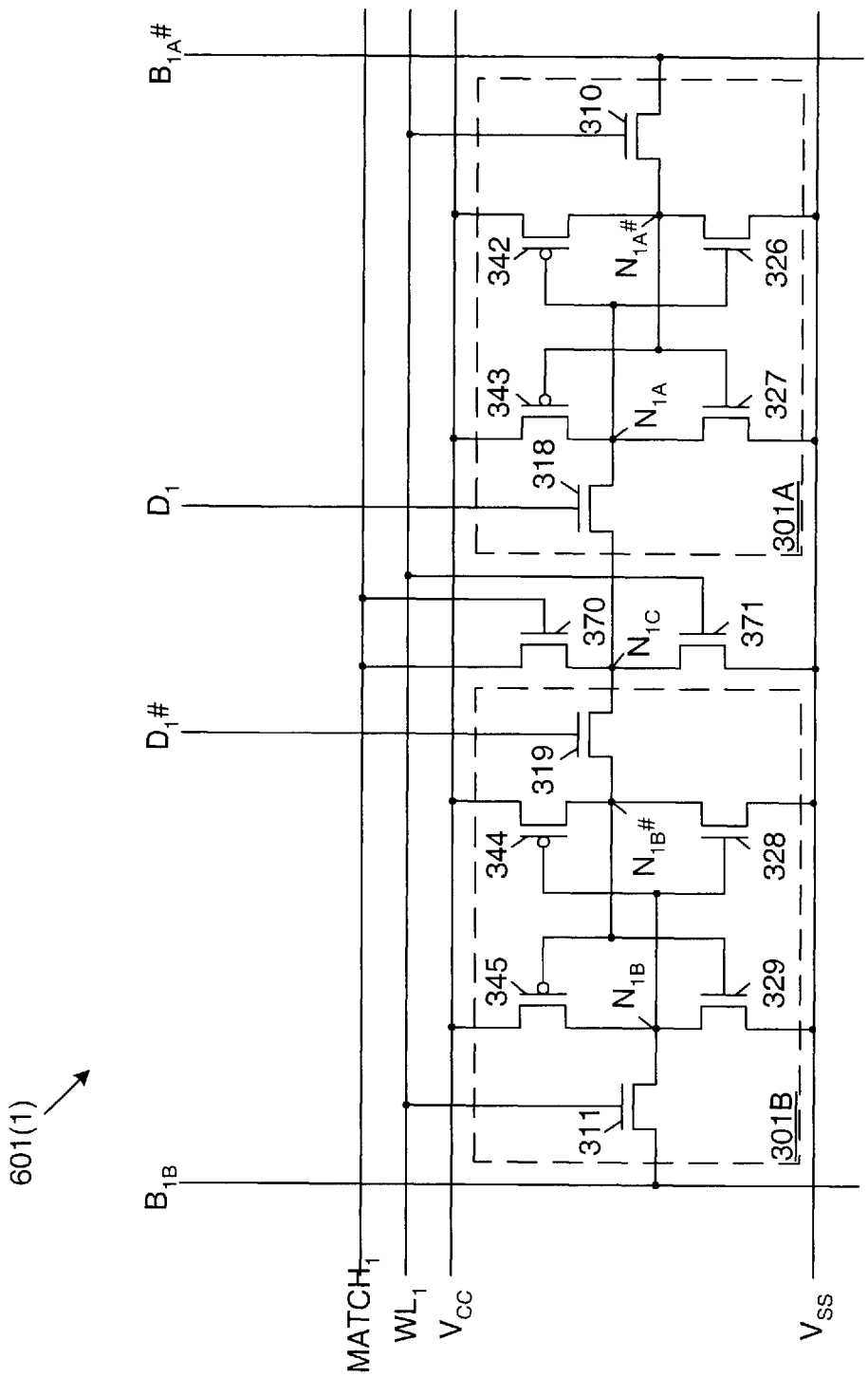
FIG. 6A is a schematic diagram of another ternary CAM cell in accordance with an embodiment of the present invention.

FIG. 6A is a schematic diagram of ternary CAM cell 601(1) in accordance with another embodiment of the present invention. Similar elements between CAM cells 601(1) and 501(1) (FIG. 5A) are labeled similarly. Thus, CAM cell 601(1) includes SRAM cells 301A and 301B and n-channel transistors 370 and 371. CAM cell 601(1) is coupled to bit lines B$_{1B}$ and B$_{1A}$#, data lines D$_1$ and D$_1$#, word line WL$_1$, the V$_{CC}$ voltage supply source, match line MATCH$_1$, and the V$_{SS}$ voltage supply source as described below. A no-match condition in CAM cell 601(1) occurs when match line MATCH$_1$ is pulled down to a logic low value as described below.

CAM cell 601(1) includes SRAM cells 301A and 301B. Transistor 310 is coupled as an access transistor between bit line B$_{1A}$# and node N$_{1A}$#. The gate of transistor 310 is coupled to word line WL$_1$. Transistor 318 is coupled as an access transistor between node N$_{1C}$ and node N$_{1A}$. The gate of transistor 318 is coupled to data line D$_1$. SRAM cell 301A is coupled between the V$_{CC}$ power supply source (e.g., at terminals of transistors 342 and 343) and the V$_{SS}$ power supply source (e.g., at terminals of transistors 326 and 327). Transistor 311 is coupled as an access transistor between bit line B$_{1B}$ and node N$_{1B}$. The gate of transistor 311 is coupled to word line WL$_1$. Transistor 319 is coupled as an access transistor between node N$_{1C}$ and node N$_{1B}$#. The gate of transistor 319 is coupled to data line D$_1$#. SRAM cell 301B is coupled between the V$_{CC}$ power supply source (e.g., at terminals of transistors 344 and 345) and the V$_{SS}$ power supply source (e.g., at terminals of transistors 328 and 329). Transistor 370 is coupled between match line MATCH$_1$ and node N$_{1C}$. Transistor 370 also has a gate coupled to match line MATCH$_1$. Transistor 371 is coupled between node N$_{1C}$ and the V$_{SS}$ power supply source. Transistor 371 has a gate coupled to word line WL$_1$.

The operation of CAM cell 601(1) is similar to that of CAM cell 501(1), and will now be described. In a standby state, word line WL$_1$, data lines D$_1$ and D$_1$#, and match line MATCH$_1$ are pulled down to logic low values, thereby turning off transistors 310, 311, and 371, 318, 319, and 370, respectively. Under these conditions, SRAM cells 301A and 301B latch the values stored at nodes N$_{1A}$ and N$_{1B}$ (and the inverted values stored at N$_{1A}$# and N$_{1B}$#), respectively.

Similarly to that described for CAM cell 501(1), a write operation to CAM cell 601(1) may accomplish one of three tasks: data is written to SRAM cell 301A, data is written to SRAM cell 301B, or data is written to both SRAM cells 301A and 301B simultaneously. Because SRAM cells 301A and 301B each hold a single bit, one of a logic high value and a logic low value may be written to each of SRAM cells 301A and 301B. Because CAM cell 601(1) holds two bits (i.e., the values stored in SRAM cells 301A and 301B), one of a logic high value, a logic low value, and a logic "don't care" value may be written to CAM cell 601(1). To write a data value to CAM cell 601(1), bit line B$_{1A}$# and data line D$_1$ are held to a first write data value and bit line B$_{1B}$ and data line D$_1$# are held to a second write data value. Match line MATCH$_1$ is held to a logic low value, thereby de-coupling match line MATCH$_1$ from node N$_{1C}$ through turned off transistor 371. Word line WL$_1$ is pulled up to logic high values to perform the write operation and couple node N$_{1C}$ to the V$_{SS}$ voltage power supply.

Write operations for logic high values, logic low values, and logic "don't care" values are performed similarly to those of CAM cell 501(1) described above.

SRAM cell 301A may be written independently of SRAM cell 301B. To write a first data value to SRAM cell 301A, bit line B$_{1A}$# and data line D$_1$ are held to the inverse of the first write data value. Data line $D_1\#$ and match line $MATCH_1$ are held to logic low values. The logic low value of match line $MATCH_1$ de-couples the logic low value of match line $MATCH_1$ from node $N_{1C}$. Bit line $B_{1B}$ is held to a logic high value to prevent disturbance of the data stored in SRAM cell 301B. Word line $WL_1$ is pulled up to a logic high value to perform the write operation and couple node $N_{1C}$ to the $V_{SS}$ voltage power supply. Under these conditions, a write operation to SRAM cell 301A is performed similarly to a write operation to SRAM cell 501(1) (FIG. 5A).

SRAM cell 301B may be written independently of SRAM cell 301A in a fashion similar to that described for SRAM cell 301A above. To write a first data value to SRAM cell 301B, bit line $B_{1B}$ and data line $D_1\#$ are held to the first write data value. Data line $D_1$ and match line $MATCH_1$ are held to logic low values. The logic low value of match line $MATCH_1$ de-couples the logic low value of match line $MATCH_1$ from node $N_{1C}$. Bit line $B_{1A}\#$ is held to a logic high value to prevent disturbance of the data stored in SRAM cell 301A. Word line $WL_1$ is pulled up to a logic high value to perform the write operation and couple node $N_{1C}$ to the $V_{SS}$ voltage power supply. Under these conditions, a write operation to SRAM cell 301B is performed similarly to a write operation to SRAM cell 301B (FIG. 5A).

To read a data value from both SRAM cells 301A and 301B simultaneously (i.e., to read a data value from CAM cell 601(1)), bit lines $B_{1A}\#$ and $B_{1B}$ are both pre-charged to a logic high value. Data lines $D_1$ and $D_1\#$ are held to logic low values. The value of match line $MATCH_1$ does not matter and is therefore left in it's previous state. Word line $WL_1$ is pulled up to a logic high value to perform the read operation. Read operations for logic high values, logic low values, and logic "don't care" values are then performed similarly to those of CAM cell 501(1) (FIG. 5A) described above.

SRAM cell 301A may be read independently of SRAM cell 301B. To read a first data value from SRAM cell 301A, bit line $B_{1A}\#$ is pre-charged to a logic high value. Data line $D_1$ and data line $D_1\#$ are held to logic low values. Bit line $B_{1B}$ is held to a logic high value to prevent disturbance of SRAM cell 301B. The value of match line $MATCH_1$ does not matter, and so is preferentially left in it's last state. Word line $WL_1$ is pulled up to a logic high value to perform the read operation. Read operations for logic high values and logic low values are then performed similarly to those of SRAM cell 301A (FIG. 5A) described above.

Similarly, SRAM cell 301B may be read independently of SRAM cell 301A. To read a first data value from SRAM cell 301B, bit line $B_{1B}$ is pre-charged to a logic high value. Data line $D_1$ and data line $D_1\#$ are held to logic low values. Bit line $B_{1A}\#$ is held to a logic high value to prevent disturbance of SRAM cell 301A. The value of match line $MATCH_1$ does not matter, and so is preferentially left in it's last state. Word line $WL_1$ is pulled up to a logic high value to perform the read operation. Read operations for logic high values and logic low values are then performed similarly to those of SRAM cell 301B (FIG. 5A) described above.

A compare operation from CAM cell 601(1) may accomplish one of three tasks: applied data is compared to SRAM cell 301A, applied data is compared to SRAM cell 301B, or applied data is compared to both SRAM cells 301A and 301B simultaneously. To compare a data value to CAM cell 601(1), match line $MATCH_1$ is brought to a logic high value. Word line $WL_1$ is held to a logic low value, thereby de-coupling bit lines $B_{1B}$ and $B_{1A}\#$ and the $V_{SS}$ power voltage supply from nodes $N_{1B}$, $N_{1A}\#$, and $N_{1C}$, respectively. Match line $MATCH_1$ is pre-charged to a logic high value, thereby coupling a pre-charged logic high value to node $N_{1C}$. The value of bit lines $B_{1B}$ and $B_{1A}\#$ do not matter and are therefore left in their previous states. A compare data value is applied to data lines $D_1$ and $D_1\#$ to perform the compare operation. Compare operations for logic high values, logic low values, and logic "don't care" values are then performed similarly to those of SRAM cell 501(1) FIG. 5A) described above.

SRAM cell 301A may be compared to a data value independently of SRAM cell 301B. To compare a first data value to SRAM cell 301A, match line $MATCH_1$ is pre-charged to a logic high value. Word line $WL_1$ is held to a logic low value, thereby de-coupling node $N_{1C}$ from the $V_{SS}$ power supply source via turned of transistor 371 and de-coupling bit lines $B_{1B}$ and $B_{1A}\#$ from nodes $N_{1B}$ and $N_{1A}\#$, respectively. The pre-charged logic high value of match line $MATCH_1$ couples a pre-charged logic high value to node $N_{1C}$. Data line $D_1\#$ is held to a logic low value. The value of bit lines $B_{1B}$ and $B_{1A}\#$ do not matter and are therefore left in their previous state. A compare data value is applied to data line $D_1$ to perform the compare operation. The logic low values of word line $WL_1$ and data line $D_1\#$ isolate CAM cell 301B from the compare operation. The compare operation is then carried out similarly to that described above with respect to a comparison operation on CAM cell 601(1).

Similarly, SRAM cell 301B may be compared to a data value independently of SRAM cell 301A. To compare a first data value to SRAM cell 301B, match line $MATCH_1$ is pre-charged to a logic high value. Word line $WL_1$ is held to a logic low value, thereby de-coupling node $N_{1C}$ from the $V_{SS}$ supply source via turned off transistor 371 and de-coupling bit lines $B_{1B}$ and $B_{1A}\#$ from nodes $N_{1B}$ and $N_{1A}\#$, respectively. The pre-charged logic high value of match line $MATCH_1$ couples a pre-charged logic high value to node $N_{1C}$. Data line $D_1$ is held to a logic low value. The value of bit lines $B_{1B}$ and $B_{1A}\#$ do not matter and are therefore left in their previous state. A data value equivalent to the inverted compare data value is applied to data line $D_1\#$ to perform the compare operation. The logic low values of word line $WL_1$ and data line $D_1$ isolate CAM cell 301A from the compare operation. The compare operation is then carried out similarly to that described above with respect to a comparison operation on CAM cell 601(1).

In this manner, the beneficial result of having a CAM cell which results in a logic high value of the match line for a match condition and results in a logic low value of the match line for a no-match condition is achieved while maintaining a small CAM cell size in another embodiment of the present invention.

Figure 6B:
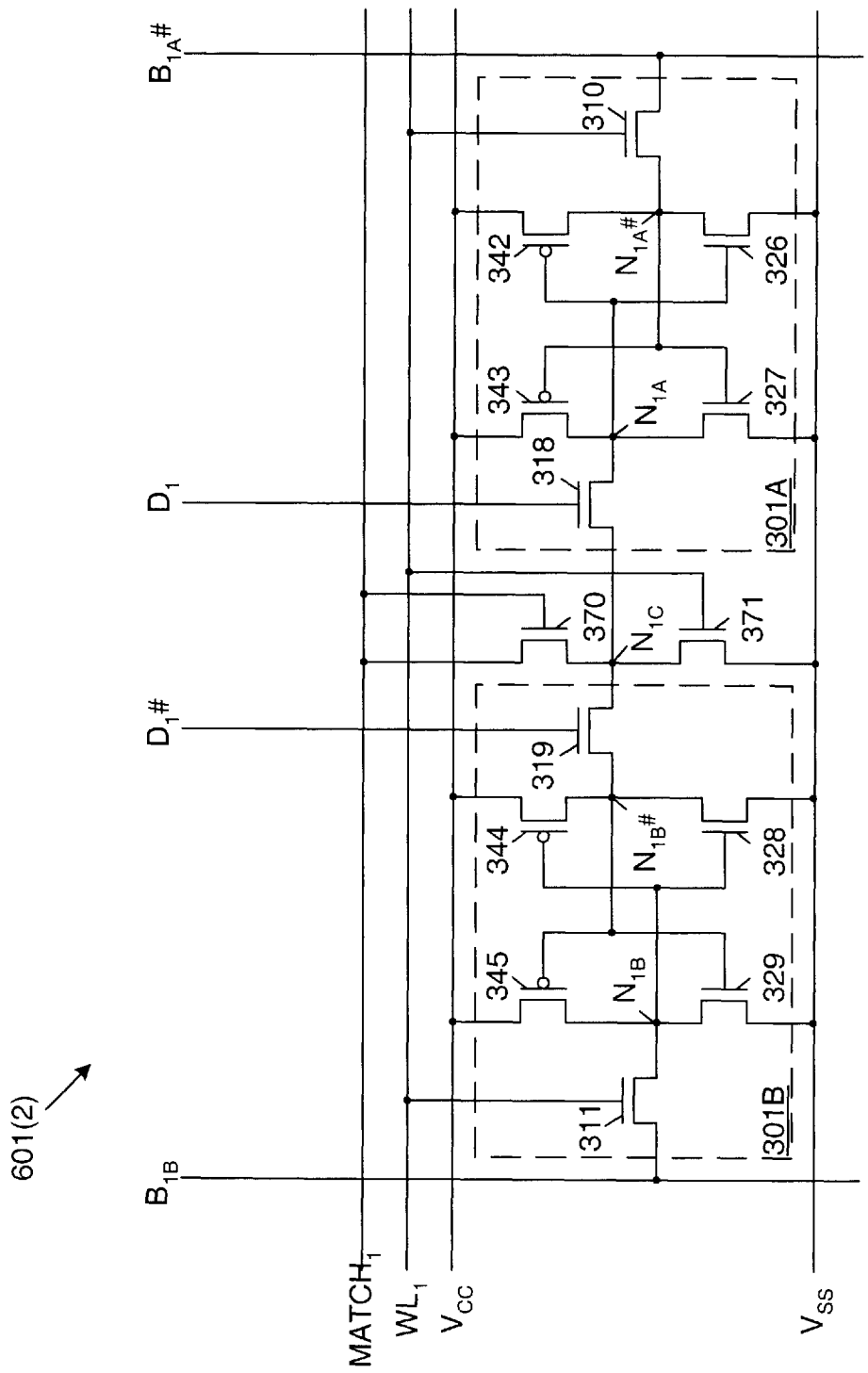
FIG. 6B is a schematic diagram of another ternary CAM cell in accordance with another embodiment of the present invention.

FIG. 6B is a schematic diagram of ternary CAM cell 601(2) in accordance with a variation of the present embodiment. Similar elements between CAM cells 601(1) (FIG. 6A) and 601(2) are labeled similarly. Thus, CAM cell 601(2) includes SRAM cells 301A and 301B and n-channel transistors 370 and 371. In contrast to CAM cell 601(1), transistors 326–329 of CAM cell 601(2) have terminals coupled to low match line $LM_1$.

CAM cell 601(2) functions similarly to CAM cell 601(1). However, the use of low match line $LM_1$ enables a beneficial power savings in CAM cell 601(2), for example, during a standby condition when low match line $LM_1$ is allowed to float above a grounding voltage.

Fourth Embodiment: 9-T Four-state CAM Cell Plus Mask

Figure 7:
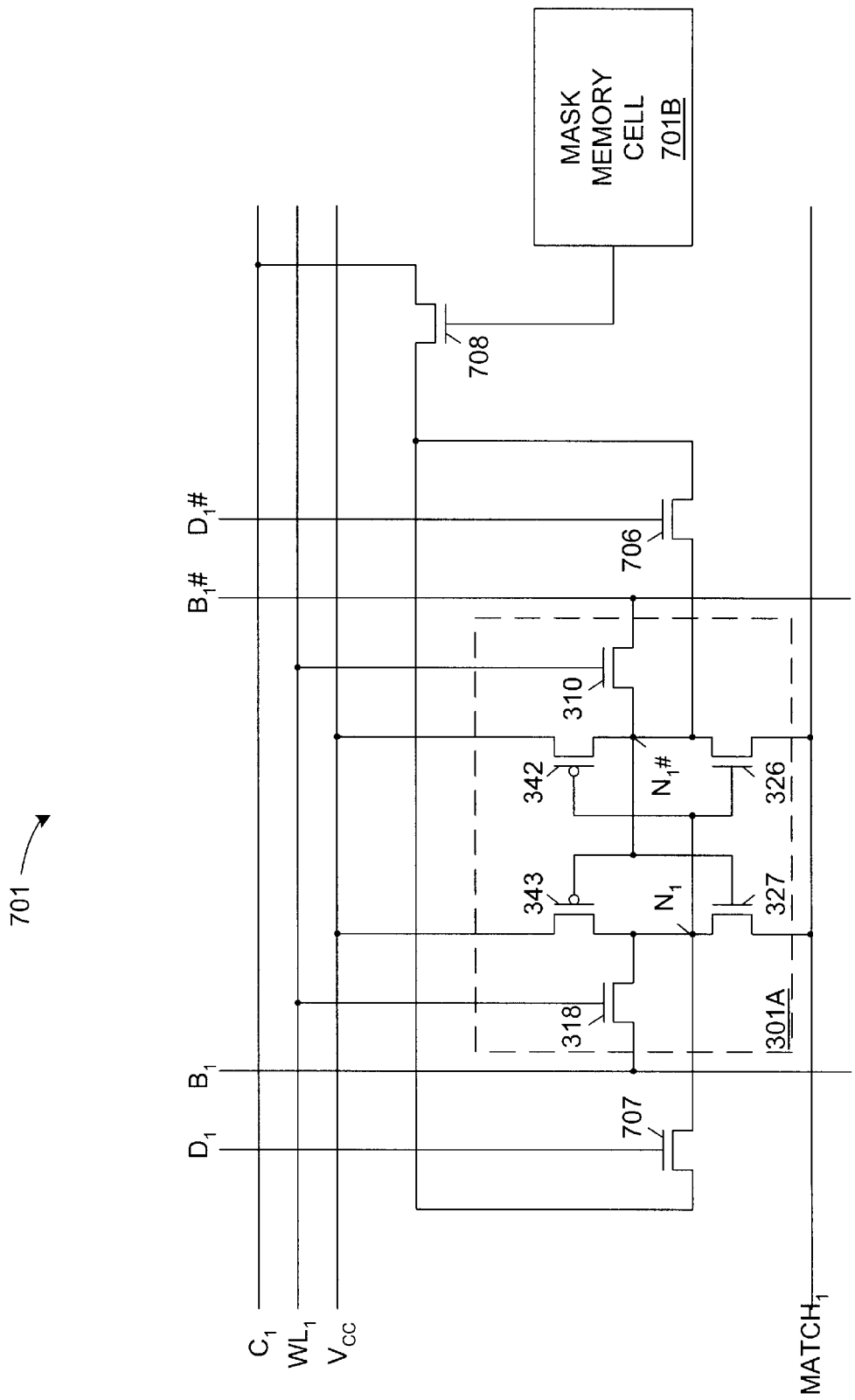
FIG. 7 is a schematic diagram of a four-state CAM cell in accordance with an embodiment of the present invention.

FIG. 7 is a schematic diagram of four-state CAM cell 701 in accordance with another embodiment of the present invention. CAM cell 701 includes SRAM cell 301A, mask memory cell 701B, and n-channel transistors 706–708. CAM cell 701 is coupled to bit lines $B_1$ and $B_1\#$, data lines $D_1$ and $D_1\#$, control line $C_1$, word line $WL_1$, the $V_{CC}$ voltage supply source, and match line $MATCH_1$ as described below. Mask memory cell 701B may be any type of memory storage cell, including 1-T, 4-T, 5-T, 6-T, etc. memory cells. Mask memory cell 701B may be coupled to word line $WL_1$ and one or more of bit lines $B_1$ and $B_1\#$. Thus, the total number of transistors in CAM cell 701 includes the sum of the nine transistors shown including SRAM cell 301A plus the number of transistors in the chosen embodiment of memory mask 701B.

SRAM 301A is coupled between the $V_{CC}$ voltage supply source and match line $MATCH_1$. Access transistor 310 is coupled between bit line $B_1\#$ and node $N_1\#$. Access transistor 318 is coupled between bit line $B_1$ and node $N_1$. The gates of access transistors 310 and 318 are coupled to word line $WL_1$. Access transistor 706 is coupled between a first terminal of mask transistor 708 and node $N_1\#$. Access transistor 707 is coupled between a first terminal of mask transistor 708 and node $N_1$. The gates of access transistors 706 and 707 are coupled to data line $D_1\#$ and $D_1$, respectively. Mask transistor 708 has a second terminal coupled to control line $C_1$ and a gate coupled to mask memory cell 701B.

In one variation of the present invention, mask memory cell 701B is a conventional memory cell that is conventionally operated. In another variation of the present invention, mask memory cell 701B is an SRAM cell according to the present invention (e.g., SRAM cell 301A) and operated as described herein. Thus, operations to mask memory cell 701B will not be described in detail. As a result, the descriptions below with respect to CAM cell 701 describe operations reading from and writing to SRAM cell 301A.

A no-match condition in CAM cell 701 occurs when match line $MATCH_1$ is pulled up to a logic high value as described below.

The operation of CAM cell 701 will now be described. CAM cell 701 operations include standby, write, read, and compare operations. In a standby operation, word line $WL_1$ and data lines $D_1$ and $D_1\#$ are pulled down to logic low values, thereby turning off access transistors 310 and 318, 707, and 706, respectively. The match line $MATCH_1$ is held to a logic low value and the control line $C_1$ is preferentially left in it's last state. Under these conditions, SRAM cell 301A latches the values at node $N_1$ and the inverted value at node $N_1\#$.

SRAM cell 301A holds a single bit. Thus, one of a logic high value and a logic low value may be written to SRAM cell 301A. Note that mask memory cell 701B also holds a single bit (i.e., one of a logic high value and a logic low value).

To write a data value (e.g., a logic high value) to SRAM cell 301A, bit line $B_1$ is held to the first data value (e.g., a logic high value) and bit line $B_1\#$ is held to the inverse of the first write data value (e.g., a logic low value). Data lines $D_1$ and $D_1\#$ are held to logic low values, thereby turning of transistors 707 and 706, respectively. Turned off transistors 706 and 707 de-couple SRAM cell 301A from the first terminal of transistor 708. Thus, the value stored in mask memory cell 701B does not affect the write operation. Match line $MATCH_1$ is held to a logic low value. The value of control line $C_1$ does not matter, and therefore is left in it's last state. Word line $WL_1$ is pulled up to a logic high value to perform the write operation.

To write a logic high value to SRAM cell 301A, bit line $B_1$ is held to a logic high value (i.e., a first write data value) and bit line $B_1\#$ is held to a logic low value (i.e., a second write data value). Under these conditions, the logic high value of word line $WL_1$ turns on transistors 310 and 318. As a result, turned on transistor 310 couples the logic low value of bit line $B_1\#$ to node $N_1\#$, thereby pulling up node $N_1$ to a logic high value through turned on transistor 343. Note that turned on transistor 318 also pulls up node $N_1$ to a logic high value. As a result, SRAM cell 301A stores a logic high value.

To write a logic low value to SRAM cell 301A, bit line $B_1$ is held to a logic low value (i.e., a first write data value) and bit line $B_1\#$ is held to a logic high value (i.e., a second write data value). Under these conditions, the logic high value of word line $WL_1$ turns on transistors 310 and 318. As a result, turned on transistor 318 couples the logic low value of bit line $B_1$ to node $N_1$, thereby pulling up node $N_1\#$ to a logic high value through turned on transistor 342. Note that turned on transistor 310 also pulls up node $N_1\#$ to a logic high value. As a result, SRAM cell 301A stores a logic low value.

A read operation from CAM cell 701 will now be described. As described above, because SRAM cell 301A holds a single bit, one of a logic high value and a logic low value may be read from SRAM cell 301A. To read a data value from SRAM cell 301A, both bit lines $B_1\#$ and $B_1$ are pre-charged to a logic high value. Data lines $D_1$ and $D_1\#$ and match line $MATCH_1$ are held to logic low values. The value of control line $C_1$ does not matter and is therefore left in it's previous state. Word line $WL_1$ is pulled up to logic a high value to perform the read operation.

During a read operation from CAM cell 701, the logic high value of word line $WL_1$ turns on transistor 318, thereby coupling the pre-charged logic high value of bit line $B_1$ to node $N_1$. As a result, a logic low value stored at node $N_1$ pulls down bit line $B_1$ to a logic low value and a logic high value stored at node $N_1$ causes bit line $B_1$ to remain at a logic high value. Similarly, the logic high value of word line $WL_1$ turns on transistor 310, thereby coupling the pre-charged logic high value of bit line $B_1\#$ to node $N_1\#$. As a result, a logic low value stored at node $N_1\#$ pulls down bit line $B_1\#$ to a logic low value and a logic high value stored at node $N_1\#$ causes bit line $B_1\#$ to remain at a logic high value. Because bit line $B_1\#$ is coupled to the inverted storage node of SRAM cell 301A (i.e., node $N_1\#$), bit line $B_1\#$ is an inverted value bit line. Thus, the data read from bit line $B_1\#$ (i.e., the data value stored at node $N_1\#$) is the opposite value of the data value stored in SRAM cell 301A (i.e., the data value stored at node $N_{1A}$).

For example, if CAM cell 701 stores a logic high value, then node $N_1$ stores a logic high value and node $N_1\#$ stores a logic low value. Under these conditions, a read operation results in bit line $B_1\#$ having a logic low value and bit line $B_1$ having a logic high value. As a result, a logic high value is read from CAM cell 701. Note that the logic value stored in mask memory cell 701B does not affect this read value. Therefore, a read operation from CAM cell 701 returns a logic high value both when CAM cell 301A stores a logic high value (e.g., mask memory cell 701B stores a logic high value) and when CAM cell 301A stores a logic high "don't care" value (e.g., mask memory cell 701B stores a logic low value). Similarly, a read operation from CAM cell 701 returns a logic low value both when CAM cell 301A stores a logic low value (e.g., mask memory cell 701B stores a logic high value) and when CAM cell 301A stores a logic low "don't care" value (e.g., mask memory cell 701B stores a logic low value). In this way, CAM cell 701 provides meaningful data for "don't care" values.

A compare operation from CAM cell 701 will now be described. Match line $MATCH_1$ is pre-charged to a logic low value. Control line $C_1$ is held to a logic high value and word line $WL_1$ is held to a logic low value. The value of bit lines $B_1$ and $B_1\#$ do not matter and are therefore left in their previous states. A compare data value is applied to data lines $D_1$ and $D_1\#$ to perform the compare operation.

To compare a logic high compare data value to CAM cell 701, data line $D_1$ is held to a logic high value and data line $D_1\#$ is held to a logic low value. Under these conditions, the logic low value of data line $D_1\#$ turns off transistor 706, thereby de-coupling the first terminal of transistor 708 from node $N_1\#$. The logic high value of data line $D_1$ turns on transistor 707, thereby coupling the first terminal of transistor 708 to node $N_1$. If mask memory cell 701B stores a logic low value, node $N_1$ is de-coupled from the logic high value of control line $C_1$ via turned off transistor 708. Thus, turned off transistor 708 prevents a change in the value of match line $MATCH_1$ due to the value stored in CAM cell 701. In this way, CAM cell 701 is masked from the compare operation. As a result, whether SRAM cell 301A stores a logic high value or a logic low value, CAM cell 701 effectively stores a logic "don't care" value.

If mask memory cell 701B stores a logic high value, node $N_1$ is coupled to the logic high value of control line $C_1$ via turned on transistor 708. As a result, CAM cell 701 participates in the compare operation. If CAM cell 701 stores a matching logic high value (SRAM cell 301A node $N_1$ stores a logic high value), then node $N_1$ is de-coupled from match line $MATCH_1$ due to turned off transistor 327. As a result, match line $MATCH_1$ remains in a logic low state, thereby indicating a match condition. If CAM cell 701 stores a non-matching logic low value (SRAM cell 301A node $N_1$ stores a logic low value), then node $N_1$ is coupled to match line $MATCH_1$ through turned on transistor 327. As a result, match line $MATCH_1$ is pulled up to the logic high value of control line $C_1$ through turned on transistors 327, 707, and 708, thereby indicating a no-match condition.

To compare a logic low compare data value to CAM cell 701, data line $D_1$ is held to a logic low value and data line $D_1\#$ is held to a logic high value. Under these conditions, the logic low value of data line $D_1$ turns off transistor 707, thereby de-coupling the first terminal of transistor 708 from node $N_1$. The logic high value of data line $D_1\#$ turns on transistor 706, thereby coupling the first terminal of transistor 708 to node $N_1\#$. As described above, if mask memory cell 701B stores a logic low value, then CAM cell 701 is masked from the compare operation. However, if mask memory cell 701B stores a logic high value, then CAM cell 701 participates in the compare operation. If CAM cell 701 stores a matching logic low value (SRAM cell 301A node $N_1$ stores a logic low value), then node $N_1\#$ is de-coupled from match line $MATCH_1$ due to turned off transistor 326. As a result, match line $MATCH_1$ remains in a logic low state, thereby indicating a match condition. If CAM cell 701 stores a non-matching logic high value (SRAM cell 301A node $N_1$ stores a logic high value), then node $N_1\#$ is coupled to match line $MATCH_1$ through turned on transistor 326. As a result, match line $MATCH_1$ is pulled up to the logic high value of control line $C_1$ through turned on transistors 326, 706, and 708, thereby indicating a no-match condition.

To compare a logic "don't care" compare data value to CAM cell 701, data lines $D_1$ and $D_1\#$ are held to logic low values. Under these conditions, the logic low values of data lines $D_1$ and $D_1\#$ turn off transistors 707 and 706, respectively, thereby de-coupling the first terminal of transistor 708 (and in turn control line $C_1$) from nodes $N_1$ and $N_1\#$. Thus, the logic value stored in SRAM cell 301A does not affect the value of match line $MATCH_1$ during the compare operation. As a result, match line $MATCH_1$ remains at a logic low value, thereby indicating a match condition for all values stored in CAM cell 701.

Operations similar to those described above may be performed on a row of CAM cells similar to CAM cell 701 by applying the techniques described above to the other CAM cells in the row. A comparison operation in CAM cell 701 results in a logic low value of the match line $MATCH_1$ if the applied comparison data value matches the data value stored in CAM cell 701, and results in a logic high value of the match line $MATCH_1$ if the applied comparison data value does not match the data value stored in CAM cell 701.

Fifth Embodiment: 9-T Four-state CAM Cell Plus Mask

Figure 8:
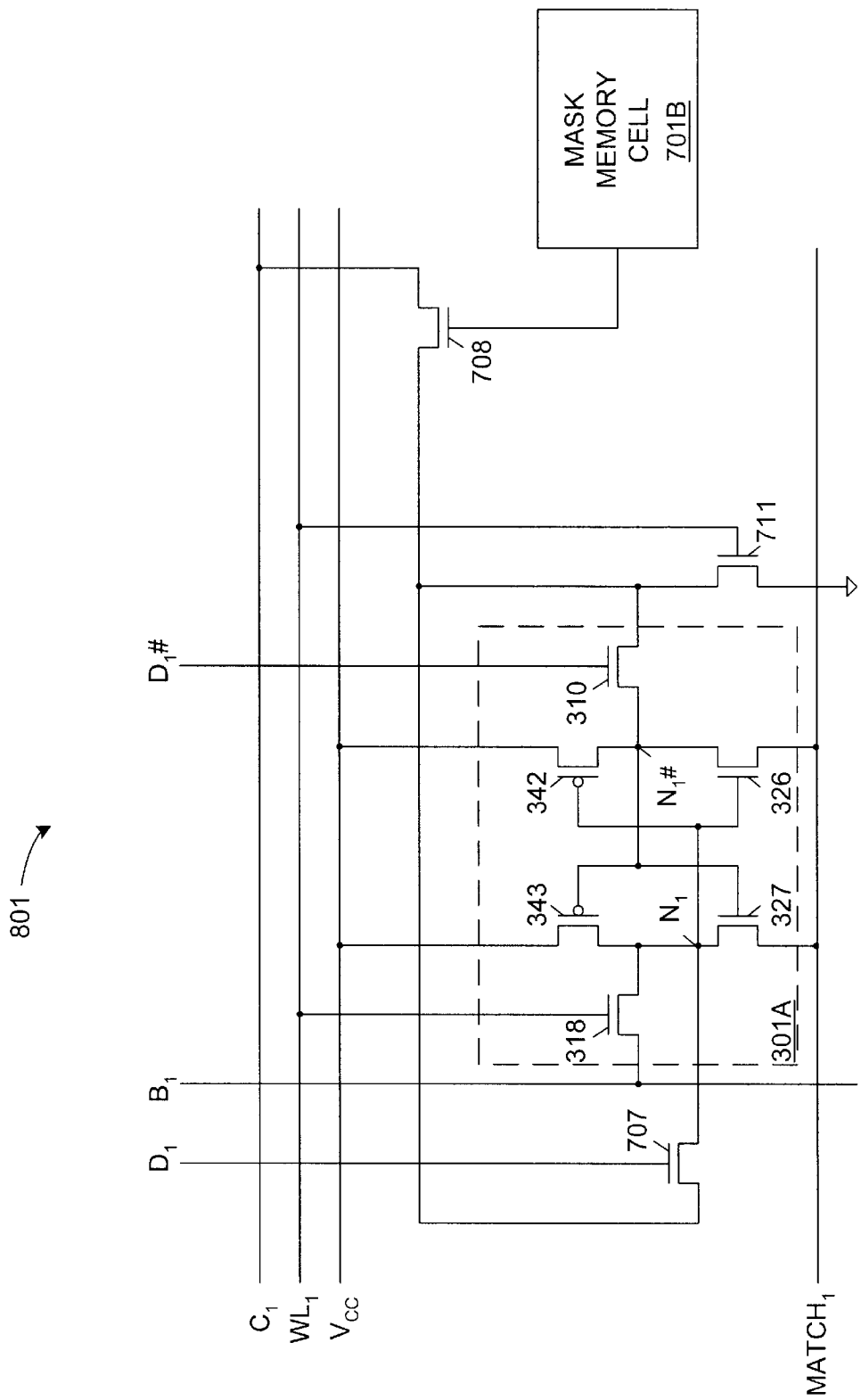
FIG. 8 is a schematic diagram of another four-state CAM cell in accordance with an embodiment of the present invention.

FIG. 8 is a schematic diagram of four-state CAM cell 801 in accordance with another embodiment of the present invention. Similar elements in CAM cells 801 and 701 (FIG. 7) are labeled similarly. CAM cell 801 includes SRAM cell 301A mask, memory cell 701B, and n-channel transistors 707, 708, and 711. CAM cell 801 is coupled to bit line $B_1$, data lines $D_1$ and $D_1\#$, control line $C_1$, word line $WL_1$, the $V_{CC}$ voltage supply source, and match line $MATCH_1$ as described below. Mask memory cell 701B may be any type of memory storage cell, including SRAM cells as described herein. Thus, the total number of transistors in CAM cell 801 includes the sum of the nine transistors shown including SRAM cell 301A plus the number of transistors in the chosen embodiment of memory mask 701B.

SRAM cell 301A is coupled between the $V_{CC}$ voltage supply source and match line $MATCH_1$. Access transistor 310 is coupled between a first terminal of mask transistor 708 and node $N_1\#$. Access transistor 318 is coupled between bit line $B_1$ and node $N_1$. Pull-down transistor 711 is coupled between a first terminal of mask transistor 708 and the $V_{SS}$ voltage supply source. The gates of access transistor 318 and pull-down transistor 711 are coupled to word line $WL_1$. Access transistor 707 is coupled between a first terminal of mask transistor 708 and node $N_1$. The gates of access transistors 310 and 707 are coupled to data line $D_1\#$ and $D_1$, respectively. Mask transistor 708 has a second terminal coupled to control line $C_1$ and a gate coupled to mask memory cell 701B.

As described above, mask memory cell 701B stores one of a logic high and a logic low value. Thus, the descriptions below with respect to CAM cell 801 describe operations reading from and writing to SRAM cell 301A.

A no-match condition in CAM cell 801 occurs when match line $MATCH_1$ is pulled up to a logic high value as described below.

The operation of CAM cell 801 will now be described. CAM cell 801 operations include standby, write, read, and compare operations. In a standby operation, word line $WL_1$ and data lines $D_1\#$ and $D_1$ are pulled down to logic low values, thereby turning off transistors 318 and 711, 310, and 707, respectively. The match line $MATCH_1$ is held to a logic low value and the control line $C_1$ is preferentially left in it's last state. Under these conditions, SRAM cell 301A latches the values at node $N_1$ and the inverted value at node $N_1\#$.

SRAM cell 301A holds a single bit. Thus, one of a logic high value and a logic low value may be written to SRAM cell 301A. To write a data value (e.g., a logic high value) to SRAM cell 301A, bit line $B_1$ and data line $D_1\#$ are held to the first data value (e.g., a logic high value). Data line $D_1$ is held to a logic low value, thereby turning of transistor 707. Turned off transistor 707 de-couples node $N_1$ of SRAM cell 301A from the first terminal of transistor 708. Both match line $MATCH_1$ and control line $C_1$ are held to logic low values. Word line $WL_1$ is pulled up to a logic high value to perform the write operation.

To write a logic high value to SRAM cell 301A, bit line B$_1$ and data line D$_1$# are held to logic high values (i.e., a first write data value). Under these conditions, the logic high value of word line WL$_1$ turns on transistors 711 and 318. Turned on transistor 711 couples a first terminal of transistor 708 to ground (e.g., the V$_{SS}$ supply source). As a result, turned on transistor 310 couples the logic low value of ground to node N$_1$#, thereby pulling up node N$_1$ to a logic high value through turned on transistor 343. Note that turned on transistor 318 also pulls up node N$_1$ to a logic high value. As a result, SRAM cell 301A stores a logic high value.

To write a logic low value to SRAM cell 301A, bit line B$_1$ and data line D$_1$# are held to logic low values (i.e., a first write data value). Under these conditions, the logic high value of word line WL$_1$ turns on transistors 711 and 318. As a result, turned on transistor 318 couples the logic low value of bit line B$_1$ to node N$_1$, thereby pulling up node N$_1$# to a logic high value through turned on transistor 342. Turned off transistor 310 de-couples node N$_1$# from the logic low value of ground applied through turned on transistor 711. As a result, SRAM cell 301A stores a logic low value.

A read operation from CAM cell 801 will now be described. As described above, because SRAM cell 301A holds a single bit, one of a logic high value and a logic low value may be read from SRAM cell 301A. To read a data value from SRAM cell 301A, bit line B$_1$# is pre-charged to a logic high value. Data lines D$_1$ and D$_1$#, control line C$_1$, and match line MATCH$_1$ are held to logic low values. Word line WL$_1$ is pulled up to logic a high value to perform the read operation.

During a read operation from CAM cell 801, the logic high value of word line WL$_1$ turns on transistor 318, thereby coupling the pre-charged logic high value of bit line B$_1$ to node N$_1$. As a result, a logic low value stored at node N$_1$ pulls down bit line B$_1$ to a logic low value and a logic high value stored at node N$_1$ causes bit line B$_1$ to remain at a logic high value.

A compare operation from CAM cell 801 will now be described. Match line MATCH$_1$ is pre-charged to a logic low value. Control line C$_1$ is held to a logic high value. Word line WL$_1$ is held to a logic low value, thereby turning off transistors 318 and 711. The value of bit line B$_1$ does not matter and is therefore left in it's previous state. A compare data value is applied to data lines D$_1$ and D$_1$# to perform the compare operation.

To compare a logic high compare data value to CAM cell 801, data line D$_1$ is held to a logic high value and data line D$_1$# is held to a logic low value. Under these conditions, the logic low value of data line D$_1$# turns off transistor 310, thereby de-coupling the first terminal of transistor 708 from node N$_1$#. The logic high value of data line D$_1$ turns on transistor 707, thereby coupling the first terminal of transistor 708 to node N$_1$. If mask memory cell 701B stores a logic low value, node N$_1$ is de-coupled from the logic high value of control line C$_1$ via turned off transistor 708. Thus, turned off transistor 708 prevents a change in the value of match line MATCH$_1$ due to the value stored in CAM cell 801. In this way, CAM cell 801 is masked from the compare operation. As a result, whether SRAM cell 301A stores a logic high value or a logic low value, CAM cell 801 effectively stores a logic "don't care" value.

If mask memory cell 801B stores a logic high value, node N$_1$ is coupled to the logic high value of control line C$_1$ via turned on transistor 708. As a result, CAM cell 801 participates in the compare operation. If CAM cell 801 stores a matching logic high value (SRAM cell 301A node N$_1$ stores a logic high value), then node N$_1$ is de-coupled from match line MATCH$_1$ due to turned off transistor 327. As a result, match line MATCH$_1$ remains in a logic low state, thereby indicating a match condition. If CAM cell 801 stores a non-matching logic low value (SRAM cell 301A node N$_1$ stores a logic low value), then node N$_1$ is coupled to match line MATCH$_1$ through turned on transistor 327. As a result, match line MATCH$_1$ is pulled up to the logic high value of control line C$_1$ through turned on transistors 327, 707, and 708, thereby indicating a no-match condition.

To compare a logic low compare data value to CAM cell 801, data line D$_1$ is held to a logic low value and data line D$_1$# is held to a logic high value. Under these conditions, the logic low value of data line D$_1$ turns off transistor 707, thereby de-coupling the first terminal of transistor 708 from node N$_1$. The logic high value of data line D$_1$# turns on transistor 310, thereby coupling the first terminal of transistor 708 to node N$_1$#. As described above, if mask memory cell 701B stores a logic low value, then CAM cell 801 is masked from the compare operation. However, if mask memory cell 701B stores a logic high value, then CAM cell 801 participates in the compare operation. If CAM cell 801 stores a matching logic low value (SRAM cell 301A node N$_1$ stores a logic low value), then node N$_1$# is de-coupled from match line MATCH$_1$ due to turned off transistor 326. As a result, match line MATCH$_1$ remains in a logic low state, thereby indicating a match condition. If CAM cell 801 stores a non-matching logic high value (SRAM cell 301A node N$_1$ stores a logic high value), then node N$_1$# is coupled to match line MATCH$_1$ through turned on transistor 326. As a result, match line MATCH$_1$ is pulled up to the logic high value of control line C$_1$ through turned on transistors 326, 310, and 708, thereby indicating a no-match condition.

To compare a logic "don't care" compare data value to CAM cell 801, data lines D$_1$ and D$_1$# are held to logic low values. Under these conditions, the logic low values of data lines D$_1$ and D$_1$# turn off transistors 707 and 310, respectively, thereby de-coupling the first terminal of transistor 708 (and in turn control line C$_1$) from nodes N$_1$ and N$_1$#. Thus, the logic value stored in SRAM cell 301A does not affect the value of match line MATCH$_1$ during the compare operation. As a result, match line MATCH$_1$ remains at a logic high value, thereby indicating a match condition for all values stored in CAM cell 801.

Operations similar to those described above may be performed on a row of CAM cells similar to CAM cell 801 by applying the techniques described above to the other CAM cells in the row. A comparison operation in CAM cell 801 results in a logic low value of the match line MATCH$_1$ if the applied comparison data value matches the data value stored in CAM cell 801, and results in a logic high value of the match line MATCH$_1$ if the applied comparison data value does not match the data value stored in CAM cell 801. As noted above, it is also beneficial to have a CAM cell which results in a logic high value of the match line for a match condition and results in a logic low value of the match line for a no-match condition.

Sixth Embodiment: 10-T Four-state CAM Cell Plus Mask

Figure 9A:
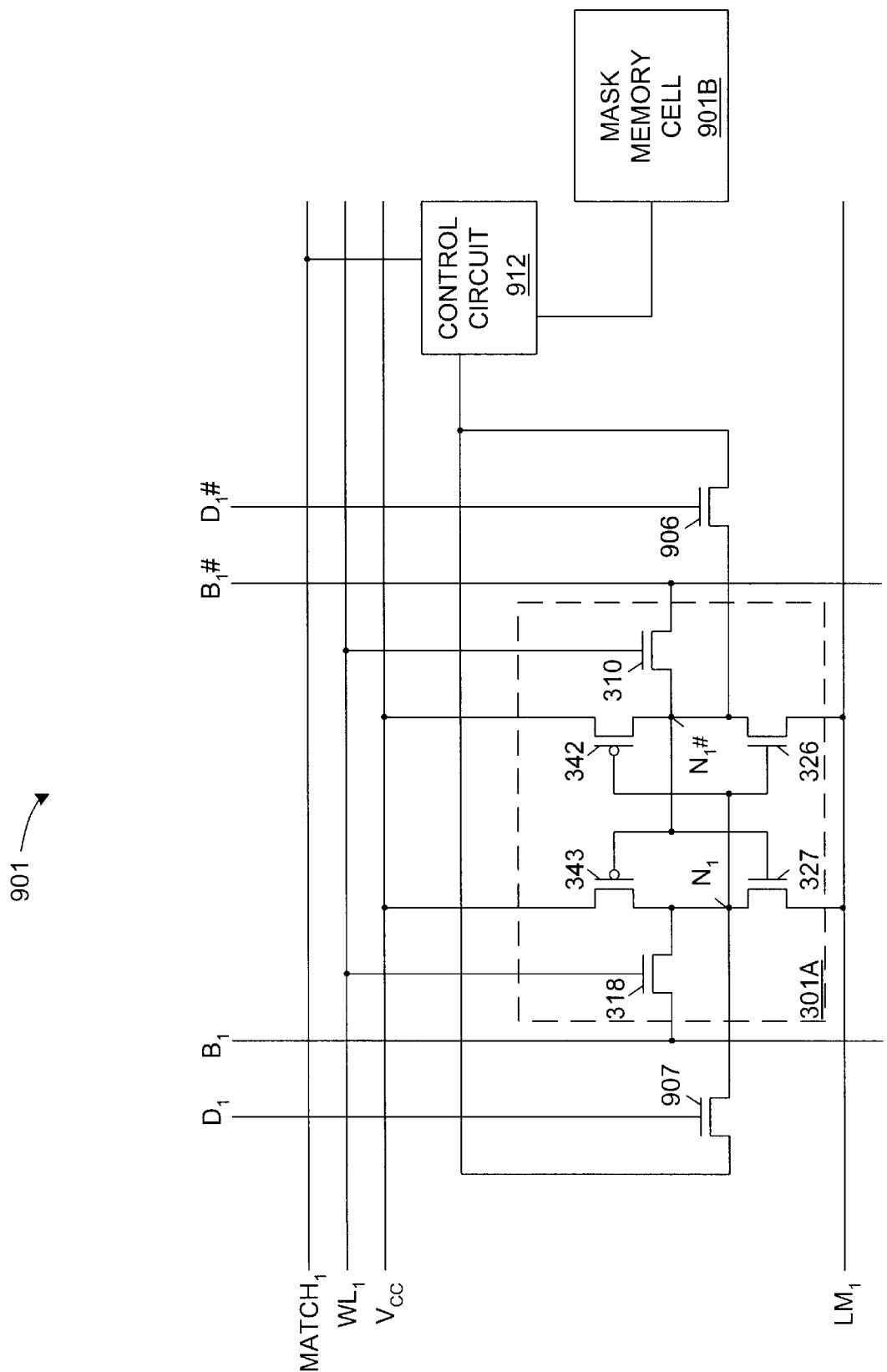
FIG. 9A is a schematic diagram of another four-state CAM cell in accordance with an embodiment of the present invention.

FIG. 9A is a schematic diagram of four-state CAM cell 901 in accordance with another embodiment of the present invention. Similar elements in CAM cells 901 and 801 (FIG. 8) are labeled similarly. CAM cell 901 includes SRAM cell 301A, mask memory cell 901B, control circuit 912, and n-channel transistors 906 and 907. CAM cell 901 is coupled to bit lines B$_1$ and B$_1$#, data lines D$_1$ and D$_1$#, word line WL$_1$, the V$_{CC}$ voltage supply source, match line MATCH$_1$, and low match line LM$_1$ as described below. Low match line LM$_1$ is a controllable line that allows transmission of logic low values (e.g., the $V_{SS}$ voltage supply source) as well as signals (e.g., a voltage of ½ the $V_{CC}$ voltage supply source). Mask memory cell 901B may be any type of memory storage cell including SRAM cells described herein. Control circuit 912 controls the coupling of a terminal of transistors 906 and 907 to match line $MATCH_1$. Several embodiments of control circuit 912 are shown in FIGS. 9B–9C.

Figure 9C:
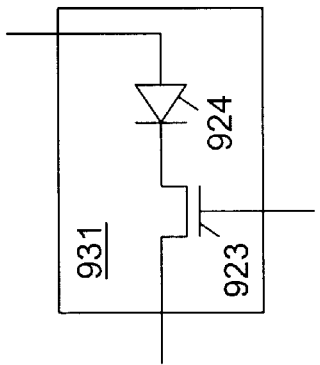
FIG. 9C is a schematic diagram of a control circuit in accordance with another embodiment of the present invention.
Figure 9E:
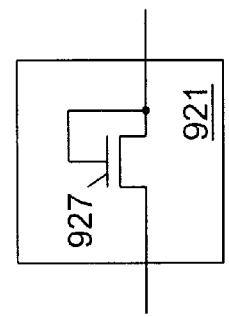
FIG. 9E is a schematic diagram of a diode in accordance with an embodiment of the present invention.
Figure 9B:
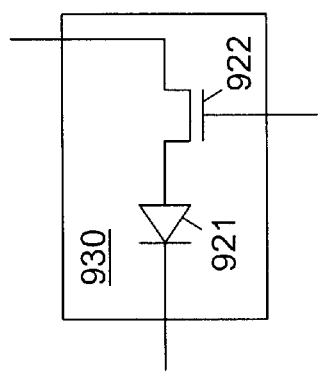
FIG. 9B is a schematic diagram of a control circuit in accordance with an embodiment of the present invention.

FIG. 9B is a first embodiment 930 of control circuit 912 (FIG. 9A). Control circuit 930 includes diode 921 and n-channel transistor 922. Diode 921 operates in a conventional manner to limit the current flow through control circuit 930. One embodiment of diode 921 is shown in greater detail in FIG. 9E.

FIG. 9C is a second embodiment 931 of control circuit 912 (FIG. 9A). Control circuit 931 includes diode 924 and n-channel transistor 923. Diode 924 operates similarly to diode 921 (FIG. 9B).

Figure 9D:
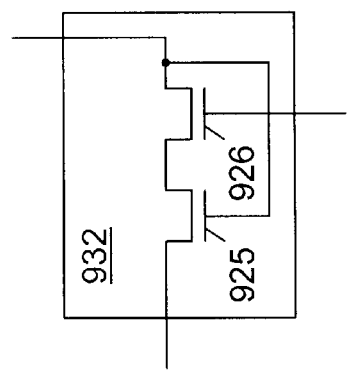
FIG. 9D is a schematic diagram of a control circuit in accordance with another embodiment of the present invention.

FIG. 9D is a third embodiment 932 of control circuit 912 (FIG. 9A). Control circuit 932 includes n-channel transistors 925 and 926. Diode 924 operates similarly to diode 921 (FIG. 9B) to limit the current flow through control circuit 932.

Returning to FIG. 9A, the total number of transistors in CAM cell 901 includes the eight transistors shown including those of SRAM cell 301A plus the number of transistors in the chosen embodiment of control circuit 912 plus the number of transistors in the chosen embodiment of memory mask 901B.

SRAM cell 301A is coupled between the $V_{CC}$ voltage supply source and the low match line $LM_1$. Access transistor 310 is coupled between bit line $B_1\#$ and node $N_1\#$. Access transistor 318 is coupled between bit line $B_1$ and node $N_1$. The gates of access transistors 310 and 318 are coupled to word line $WL_1$. Access transistor 906 is coupled between a first terminal of control circuit 912 and node $N_1\#$. Access transistor 907 is coupled between a first terminal of control circuit 912 and node $N_1$. The gates of access transistors 906 and 907 are coupled to data line $D_1\#$ and $D_1$, respectively. Control circuit 912 has a second terminal coupled to match line $MATCH_1$ and a third terminal coupled to mask memory cell 901B.

As described above, mask memory cell 901B stores one of a logic high and a logic low value. One stored logic value (e.g., a logic high value) will close control circuit 912 to form a connection between terminals of transistors 906 and 907 and match line $MATCH_1$. Another stored logic value (e.g., a logic low value) will open control circuit 912, thereby de-coupling terminals of transistors 906 and 907 from match line $MATCH_1$. Note that other embodiments of control circuit 912 may cause a connection to be formed when mask memory cell 901B stores a logic low value and open a circuit when mask memory cell 901B stores a logic high value. The descriptions below with respect to CAM cell 901 describe operations reading from and writing to SRAM cell 301A with this understanding.

A no-match condition in CAM cell 901 occurs when match line $MATCH_1$ is pulled down to a logic low value as described below.

The operation of CAM cell 901 will now be described. CAM cell 901 operations include standby, write, read, and compare operations. In a standby operation, word line $WL_1$ and data lines $D_1\#$ and $D_1$ are pulled down to logic low values, thereby turning off transistors 310 and 318, 906, and 907, respectively. The value of match line $MATCH_1$ and bit lines $B_1$ and $B_1\#$ do not matter and are therefore held to their previous states. Low match line $LM_1$ is held to a logic low value. Under these conditions, SRAM cell 301A latches the values at node $N_1$ and the inverted value at node $N_1\#$.

SRAM cell 301A holds a single bit. Thus, one of a logic high value and a logic low value may be written to SRAM cell 301A. To write a data value (e.g., a logic high value) to SRAM cell 301A, bit lines $B_1$ is held to a first data value (e.g., a logic high value) and $B_1\#$ is held to a second data value (e.g., a logic low value). Data lines $D_1$ and $D_1\#$ are held to logic low values, thereby turning of transistors 907 and 906, respectively. Turned off transistors 906 and 907 de-couple SRAM cell 301A from a first terminal of control circuit 912. Thus, the value stored in mask memory cell 901B does not affect the write operation. Word line $WL_1$ is pulled up to a logic high value to perform the write operation.

To write a logic high value to SRAM cell 301A, bit line $B_1$ is held to a logic high value (i.e., a first write data value) and bit line $B_1\#$ is held to a logic low value (i.e., a second write data value). Under these conditions, the logic high value of word line $WL_1$ turns on transistors 310 and 318. Turned on transistor 310 couples the logic low value of bit line $B_1\#$ to node $N_1\#$, thereby pulling up node $N_1$ to a logic high value through turned on transistor 343. Note that turned on transistor 318 also pulls up node $N_1$ to a logic high value. As a result, SRAM cell 301A stores a logic high value.

To write a logic low value to SRAM cell 301A, bit line $B_1$ is held to a logic low value (i.e., a first write data value) and bit line $B_1\#$ is held to a logic high value (i.e., a second write data value). Under these conditions, the logic high value of word line $WL_1$ turns on transistors 310 and 318. As a result, turned on transistor 318 couples the logic low value of bit line $B_1$ to node $N_1$, thereby pulling up node $N_1\#$ to a logic high value through turned on transistor 342. Note that turned on transistor 310 also pulls up node $N_1\#$ to a logic high value. As a result, SRAM cell 301A stores a logic low value.

A read operation from CAM cell 901 will now be described. As described above, because SRAM cell 301A holds a single bit, one of a logic high value and a logic low value may be read from SRAM cell 301A. To read a data value from SRAM cell 301A, bit lines $B_1$ and $B_1\#$ are pre-charged to logic high values. Data lines $D_1$ and $D_1\#$ are held to logic low values. The value of match line $MATCH_1$ does not matter and is therefore left in it's last state. Word line $WL_1$ is pulled up to logic a high value to perform the read operation.

During a read operation from CAM cell 901, the logic high value of word line $WL_1$ turns on transistors 318, thereby coupling the pre-charged logic high value of bit line $B_1$ to node $N_1$. As a result, a logic low value stored at node $N_1$ pulls down bit line $B_1$ to a logic low value and a logic high value stored at node $N_1$ causes bit line $B_1$ to remain at a logic high value. Similarly, the logic high value of word line $WL_1$ turns on transistors 310, thereby coupling the pre-charged logic high value of bit line $B_1\#$ to node $N_1\#$. As a result, a logic low value stored at node $N_1\#$ pulls down bit line $B_1\#$ to a logic low value and a logic high value stored at node $N_1\#$ causes bit line $B_1\#$ to remain at a logic high value.

A compare operation from CAM cell 901 will now be described. Match line $MATCH_1$ is pre-charged to a logic high value. Word line $WL_1$ is held to a logic low value, thereby turning off transistors 310 and 318. Low match line $LM_1$ is held to a logic low value. The value of bit lines $B_1$ and $B_1\#$ do not matter and are therefore left in their previous states. A compare data value is applied to data lines $D_1$ and $D_1\#$ to perform the compare operation.

To compare a logic high compare data value to CAM cell 901, data line $D_1$ is held to a logic high value and data line $D_1\#$ is held to a logic low value. Under these conditions, the logic low value of data line $D_1\#$ turns off transistor 906, thereby de-coupling the first terminal of control circuit 912 from node $N_1\#$. The logic high value of data line $D_1$ turns on transistor 907, thereby coupling the first terminal of control circuit 912 to node $N_1$. If mask memory cell 901B masks the compare function (e.g., by storing a logic low value), node $N_1$ is de-coupled from the logic high value of match line $MATCH_1$ via open control circuit 912. Thus, turned open control circuit 912 prevents a change in the value of match line $MATCH_1$ due to the value stored in CAM cell 901. In this way, CAM cell 901 is masked from the compare operation. As a result, whether SRAM cell 301A stores a logic high value or a logic low value, CAM cell 901 effectively stores a logic "don't care" value.

If mask memory cell 901B does not mask the compare function, node $N_1$ is coupled to the logic high value of match line $MATCH_1$ via closed control circuit 912. As a result, CAM cell 901 participates in the compare operation. If CAM cell 901 stores a matching logic high value (SRAM cell 301A node $N_1$ stores a logic high value), then node $N_1$ is de-coupled from the logic low value of low match line $LM_1$ due to turned off transistor 327. As a result, match line $MATCH_1$ remains in a logic high state, thereby indicating a match condition. If CAM cell 901 stores a non-matching logic low value (SRAM cell 301A node $N_1$ stores a logic low value), then node $N_1$ is coupled to low match line $LM_1$ through turned on transistor 327. As a result, match line $MATCH_1$ is pulled down to the logic low value of low match line $LM_1$ through turned on transistors 327, 907, and closed circuit 912, thereby indicating a no-match condition.

To compare a logic low compare data value to CAM cell 901, data line $D_1$ is held to a logic low value and data line $D_1\#$ is held to a logic high value. Under these conditions, the logic low value of data line $D_1$ turns off transistor 907, thereby de-coupling the first terminal of control circuit 912 from node $N_1$. The logic high value of data line $D_1\#$ turns on transistor 906, thereby coupling the first terminal of control circuit 912 to node $N_1\#$. As described above, if mask memory cell 901B stores a masking logic value, then CAM cell 901 is masked from the compare operation. However, if mask memory cell 901B stores a non-masking value, then CAM cell 901 participates in the compare operation. If CAM cell 901 stores a matching logic low value (SRAM cell 301A node $N_1$ stores a logic low value), then node $N_1\#$ is de-coupled from low match line $LM_1$ due to turned off transistor 326. As a result, match line $MATCH_1$ remains in a logic high state, thereby indicating a match condition. If CAM cell 901 stores a non-matching logic high value (SRAM cell 301A node $N_1$ stores a logic high value), then node $N_1\#$ is coupled to low match line $LM_1$ through turned on transistor 326. As a result, match line $MATCH_1$ is pulled down to the logic low value of low match line $LM_1$ through turned on transistors 326, 906, and closed control circuit 912, thereby indicating a no-match condition.

To compare a logic "don't care" compare data value to CAM cell 901, data lines $D_1$ and $D_1\#$ are held to logic low values. Under these conditions, the logic low values of data lines $D_1$ and $D_1\#$ turn off transistors 907 and 906, respectively, thereby de-coupling the first terminal of control circuit 912 (and in turn match line $MATCH_1$) from nodes $N_1$ and $N_1\#$. Thus, the logic value stored in SRAM cell 301A does not affect the value of match line $MATCH_1$ during the compare operation. As a result, match line $MATCH_1$ remains at a logic high value, thereby indicating a match condition for all values stored in CAM cell 901.

Operations similar to those described above may be performed on a row of CAM cells similar to CAM cell 901 by applying the techniques described above to the other CAM cells in the row. A comparison operation in CAM cell 901 results in a logic high value of the match line $MATCH_1$ if the applied comparison data value matches the data value stored in CAM cell 901, and results in a logic low value of the match line $MATCH_1$ if the applied comparison data value does not match the data value stored in CAM cell 901. In this way, the benefits of having a CAM cell, which results in a logic high value of the match line for a match condition and results in a logic low value of the match line for a no-match condition are achieved.

FIG. 9B is a schematic diagram of an embodiment of control circuit 912 (FIG. 9A) in accordance with the present invention. Control circuit 930 (an embodiment of control circuit 912) includes diode 921 and n-channel transistor 922. Transistor 922 has a gate coupled to mask memory cell 901B, a first terminal coupled to match line $MATCH_1$, and a second terminal coupled to an input terminal of diode 921. Diode 921 has an output terminal coupled to a terminal of transistor 907. Control circuit 912 operates to open a path for current to flow from match line $MATCH_1$ to a terminal of transistor 907 when mask memory cell 901B stores a logic high value and close that path when mask memory cell 901B stores a logic low value.

FIG. 9C is a schematic diagram of another embodiment of control circuit 912 (FIG. 9A) in accordance with the present invention. Control circuit 931 (an embodiment of control circuit 912) includes diode 924 and n-channel transistor 923. Control circuit 931 operates similarly to control circuit 930.

FIG. 9D is a schematic diagram of another embodiment of control circuit 912 in accordance with the present invention. Control circuit 932 (an embodiment of control circuit 912) includes n-channel transistors 925 and 926. Transistor 926 has a gate coupled to mask memory cell 901B, a first terminal coupled to match line $MATCH_1$, and a second terminal coupled to a first terminal for transistor 925. Transistor 925 has a gate coupled to match line $MATCH_1$ and a second terminal coupled to a terminal of transistor 907. Control circuit 932 operates similarly to control circuit 930.

FIG. 9E is a schematic diagram of a diode in accordance with an embodiment diodes 921 (FIG. 9B) and 924 (FIG. 9C) of the present invention. Diode 921 includes an n-channel transistor 927 having a gate coupled to a first terminal of transistor 927. The first terminal for transistor 927 is thus the input terminal of the diode and the second terminal of transistor 927 is the output terminal. Diode 921 turns off when the voltage at the input terminal falls below the threshold of transistor 927.

Seventh Embodiment: 10-T Four-state CAM Cell Plus Mask

Figure 10:
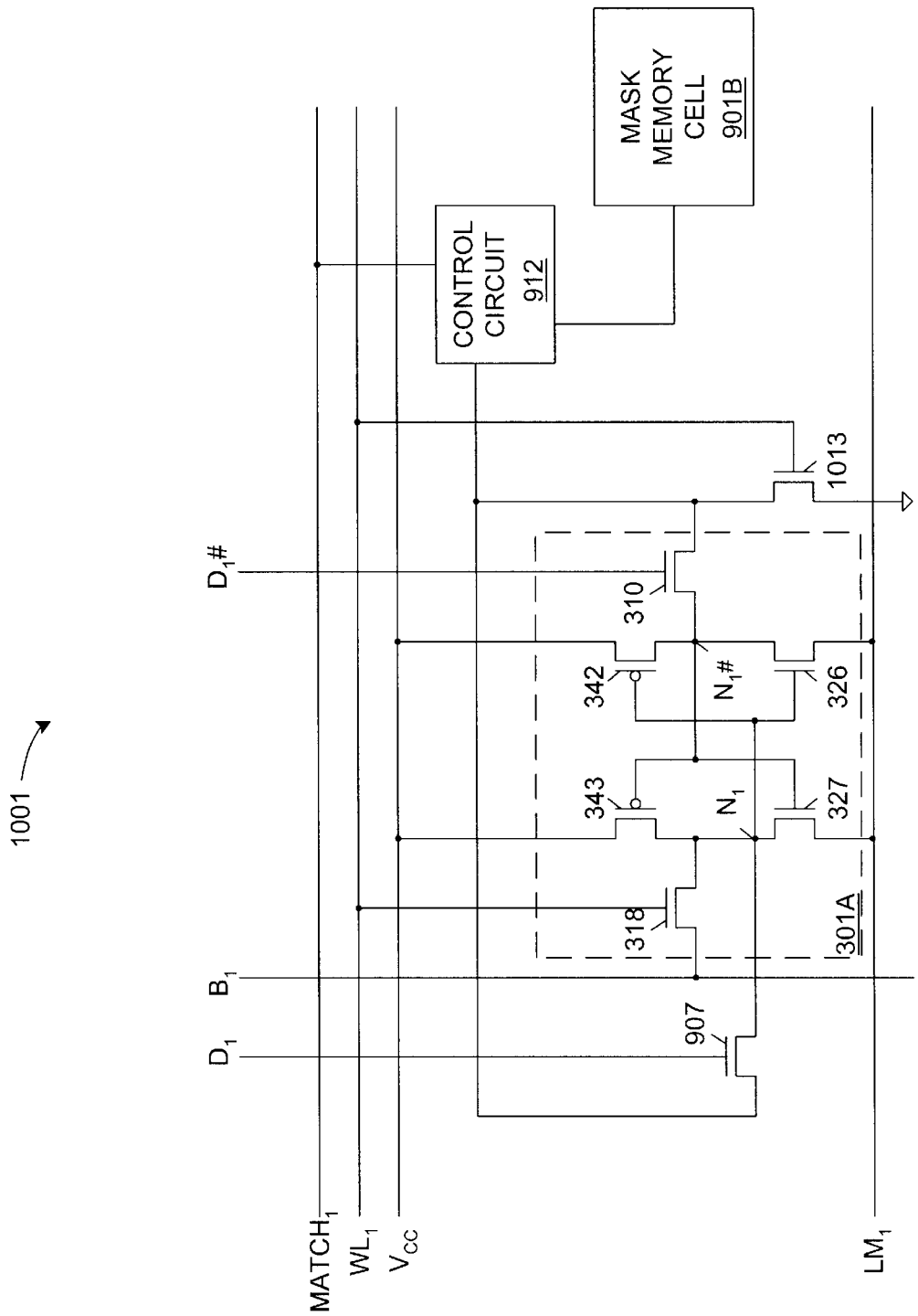
FIG. 10 is a schematic diagram of another four-state CAM cell in accordance with an embodiment of the present invention.

FIG. 10 is a schematic diagram of four-state CAM cell 1001 in accordance with another embodiment of the present invention. Similar elements in CAM cells 1001 and 901 (FIG. 9) are labeled similarly. CAM cell 1001 includes SRAM cell 301A, mask memory cell 901B, control circuit 912, and n-channel transistors 907 and 1013. CAM cell 1001 is coupled to bit line $B_1$, data lines $D_1$ and $D_1\#$, word line $WL_1$, the $V_{CC}$ voltage supply source, match line $MATCH_1$, and low match line $LM_1$ as described below. Low match line $LM_1$ is a controllable line that allows transmission of logic low values (e.g., a grounding voltage) as well as signals (e.g., a voltage of ½ the $V_{CC}$ voltage supply source). Mask memory cell 901B may be any type of memory storage cell including SRAM memory cells described herein. Control circuit 912 controls the coupling of a terminal of transistors 310, 907 and 1013 to match line $MATCH_1$.

The total number of transistors in CAM cell 1001 includes the sum of the eight transistors shown including those from SRAM cell 301A plus the number of transistors in the chosen embodiment of control circuit 912 plus the number of transistors in the chosen embodiment of memory mask 901B.

SRAM cell 301A is coupled between the $V_{CC}$ voltage supply source and the low match line $LM_1$. Access transistor 318 is coupled between bit line $B_1$ and node $N_1$. The gate of access transistor 318 is coupled to word line $WL_1$. Access transistor 310 is coupled between a first terminal of control circuit 912 and node $N_1$#. Access transistor 907 is coupled between a first terminal of control circuit 912 and node $N_1$. The gates of access transistors 1013 and 907 are coupled to data line $D_1$# and $D_1$, respectively. Transistor 1013 is coupled between a first terminal of control circuit 912 and the $V_{SS}$ voltage supply source. Transistor 1013 has a gate coupled to word line $WL_1$. Control circuit 912 has a second terminal coupled to match line $MATCH_1$ and a third terminal coupled to mask memory cell 901B. CAM cell 1001 operates similarly to CAM cells 901 (FIG. 9A) and 801 (FIG. 8), and will therefore not be described in detail.

Although the invention has been described in connection with the present embodiments, it is understood that this invention is not limited to the embodiment disclosed, but is capable of various modifications which would be apparent to a person skilled in the art. For example, transistors having gates coupled to the same word line may instead be coupled to separate word lines. Similarly, a low match line may be controlled to a non-grounding voltage for beneficial purposes such as reducing power consumption of the CAM cell. Thus, the invention is limited only by the following claims.

We claim:

1. A CAM cell connected between a match line and a second line in an array, the array including a plurality of data lines, the CAM cell comprising:
    a first latch for storing a first stored data value, the first latch including a first transistor connected to a first node and having a gate terminal controlled by the first stored data value; and
    a second transistor connected to the first node and having a gate terminal connected to receive a first applied data value from a first data line,
wherein, during a compare operation, the match line is coupled to the second line along a first signal path passing through the first and second transistors when the first applied data value turns on the first transistor and the first stored data value turns on the second transistor.

2. The CAM cell according to claim 1, wherein the first latch further comprises:
    a first inverter including the first transistor connected in series with a third transistor; and
    a second inverter including a fourth transistor connected in series with a fifth transistor,
wherein the gate terminal of the first transistor and a gate terminal of the third transistor are connected to a second node located between the fourth transistor and the fifth transistor, and
wherein a gate terminal of the fourth transistor and a gate terminal of the fifth transistor are connected to the first node.

3. The CAM cell according to claim 2, further comprising a first access transistor connected between the second node and a first bit line.

4. The CAM cell according to claim 3,
wherein the CAM cell also selectively couples the match line to the second line when a second applied data value is equal to a second stored data value,
wherein the first latch and the second transistor form part of a first storage cell, and
wherein the CAM cell further includes a second storage cell comprising:
    a second latch for storing the second stored data value, the latch including a sixth transistor connected to a third node and having a gate terminal controlled by the second stored data value; and
    a seventh transistor connected to the second node and having a gate terminal connected to receive the second applied data value,
wherein the match line is coupled to the second line along a second signal path passing through the sixth and seventh transistors when the second applied data value is equal to the second stored data value.

5. The CAM cell according to claim 4, wherein the first and second storage cells are static random access memory (SRAM) cells.

6. The CAM cell according to claim 4, wherein the second latch further comprises:
    a third inverter including the sixth transistor connected in series with an eighth transistor; and
    a fourth inverter including a ninth transistor connected in series with a tenth transistor,
wherein the gate terminal of the sixth transistor and a gate terminal of the eighth transistor are connected to a fourth node located between the ninth transistor and the tenth transistor, and
wherein a gate terminal of the ninth transistor and a gate terminal of the tenth transistor are connected to the third node.

7. The CAM cell according to claim 6, further comprising a second access transistor connected between the fourth node and a second bit line.

8. The CAM cell according to claim 7, wherein a gate terminal of the first access transistor is connected to a first word line, and wherein a gate terminal of the second access transistor is connected to a second word line.

9. The CAM cell according to claim 7, wherein a gate terminal of the first access transistor and a gate terminal of the second access transistor are connected to a word line.

10. The CAM cell according to claim 1,
wherein the first latch is connected between a voltage supply and the match line such that a terminal of the first transistor is connected to the match line, and
wherein a terminal of the second transistor is connected to the second line.

11. The CAM cell according to claim 1, wherein the first latch comprises:
    a first inverter including the first transistor connected in series with a third transistor between a voltage source and the match line; and
    a second inverter including a fourth transistor connected in series with a fifth transistor between the voltage source and the match line,
wherein a gate terminal of the fourth transistor and a gate terminal of the fifth transistor are connected to the first node.

12. The CAM cell according to claim 1, further comprising a third transistor connected between the second transistor and the match line and having a gate terminal connected to a third line for carrying a compare control signal,
wherein the first signal path coupling the match line to the second line passes through the first, second, and third transistors when the first applied data value is equal to the first stored data value and the compare control signal is asserted.

13. The CAM cell according to claim 12, wherein the first latch comprises:

a first inverter including the first transistor connected in series with a third transistor between a voltage source and the second line such that the first transistor is connected to the second line; and a second inverter including a fourth transistor connected in series with a fifth transistor between the voltage source and the second line, wherein a gate terminal of the fourth transistor and a gate terminal of the fifth transistor are connected to the first node.

14. The CAM cell according to claim 13, wherein the second line is connected to a constant voltage supply.

15. The CAM cell according to claim 13, wherein the second line is connected to a control circuit.

16. The CAM cell according to claim 1, further comprising a third transistor connected between the second transistor and the match line and having a gate terminal connected to the match line, wherein the match line is discharged to the second line along the first signal path passing through the first, second, and third transistors when the first applied data value is equal to the first stored data value and while a voltage level on the match line is sufficient to bias the third transistor.

17. The CAM cell according to claim 16, wherein the first latch comprises:

a first inverter including the first transistor connected in series with a fourth transistor between a voltage source and the second line such that the first transistor is connected to the second line; and a second inverter including a fifth transistor connected in series with a sixth transistor between the voltage source and the second line, wherein a gate terminal of the fifth transistor and a gate terminal of the sixth transistor are connected to the first node.

18. The CAM cell according to claim 16, further comprising:

a first access transistor connected between the second node and a first bit line and having a gate terminal connected to a word line; and a seventh transistor connected between the second line and a third node located between the second transistor and the third transistor, the seventh transistor having a gate terminal connected to the word line.

19. The CAM cell according to claim 18, wherein the second line is connected to a constant voltage supply.

20. The CAM cell according to claim 18, wherein the second line is connected to a control circuit.

21. The CAM cell according to claim 1, wherein the first latch and the first transistor form a first memory cell, the CAM cell further comprising:

a third transistor connected between the second transistor and the second line; and a second memory cell for storing a second stored data value that is applied to a gate terminal of the third transistor, wherein the match line is coupled to the second line along the first signal path passing through the first, second, and third transistors when the first applied data value is equal to the first stored data value and the second stored data value.

22. The CAM cell according to claim 21, wherein the second memory cell is an SRAM cell.

23. The CAM cell according to claim 21, wherein the first latch comprises:

a first inverter including the first transistor connected in series with a fourth transistor between a voltage source and the match line such that the first transistor is connected to the match line; and a second inverter including a fifth transistor connected in series with a sixth transistor between the voltage source and the match line, wherein a gate terminal of the fifth transistor and a gate terminal of the sixth transistor are connected to the first node, and wherein the first terminal of the first transistor and a gate terminal of the fourth transistor are connected to a second node located between the fifth transistor and the sixth transistor.

24. The CAM cell according to claim 22, further comprising a seventh transistor connected between the second node and the third transistor, wherein the seventh transistor has a gate terminal controlled by a second applied data value such that the match line is coupled to the second line through a second signal path passing through the fifth transistor, the seventh transistor, and the third transistor when the second applied data value is equal to an inverted first data value stored in the first latch and the second stored data value stored in the second memory cell.

25. The CAM cell according to claim 24, further comprising:

a first access transistor connected between the second node and a first bit line and having a gate terminal connected to a word line; and a second access transistor connected between the first node and a second bit line and having a gate terminal connected to the word line.

26. The CAM cell according to claim 24, further comprising:

a first access transistor connected between the second node and a bit line and having a gate terminal connected to a word line; and a pull-down transistor connected between a low voltage supply and a third node located between the second transistor and the third transistor, the pull-down transistor having a gate terminal connected to the word line.

27. The CAM cell according to claim 1, wherein the first latch and the first transistor form a first memory cell, the CAM cell further comprising:

a control circuit connected between the second transistor and the match line; and a second memory cell for storing a second stored data value that is transmitted to the control circuit, wherein the match line is coupled to the second line along the first signal path passing through the first transistor, the second transistor, and the control circuit when the first applied data value is equal to the first stored data value and the second stored data value.

28. The CAM cell according to claim 27, wherein the second memory cell is an SRAM cell.

29. The CAM cell according to claim 27, wherein the first latch comprises:

a first inverter including the first transistor connected in series with a fourth transistor between a voltage source and the second line such that the first transistor is connected to the second line; and a second inverter including a fifth transistor connected in series with a sixth transistor between the voltage source and the second line, wherein a gate terminal of the fifth transistor and a gate terminal of the sixth transistor are connected to the first node, and wherein the first terminal of the first transistor and a gate terminal of the fourth transistor are connected to a second node located between the fifth transistor and the sixth transistor.

30. The CAM cell according to claim 29, further comprising a seventh transistor connected between the second node and the control circuit,
wherein the seventh transistor has a gate terminal controlled by a second applied data value such that the match line is coupled to the second line through a second signal path passing through the fifth transistor, the seventh transistor, and the control circuit when the second applied data value is equal to an inverted first data value stored in the first latch and the second stored data value stored in the second memory cell.

31. The CAM cell according to claim 29, further comprising:
- a first access transistor connected between the second node and a first bit line and having a gate terminal connected to a word line; and
- a second access transistor connected between the first node and a second bit line and having a gate terminal connected to the word line.

32. The CAM cell according to claim 27, wherein the control circuit comprises a pass transistor and a diode connected in series between the match line and the second transistor, wherein a gate terminal of the pass transistor is connected to the second memory cell.

33. The CAM cell according to claim 27, wherein the control circuit comprises a first pass transistor and a second pass transistor connected in series between the latch line and the second transistor, wherein a gate terminal of the first pass transistor is connected to the match line and a gate terminal of the second pass transistor is connected to the second memory cell.

34. The CAM cell according to claim 27, further comprising:
- a first access transistor connected between the second node and a bit line and having a gate terminal connected to a word line; and
- a pull-down transistor connected between a low voltage supply and a third node located between the second transistor and the control circuit, the pull-down transistor having a gate terminal connected to the word line.

35. A CAM array including a plurality of CAM cells connected between a match line and a second line, the CAM array also including a plurality of data lines, wherein each CAM cell comprises:
- a latch for storing a data value at a first node, the latch including a first transistor connected to a second node and having a gate terminal connected to the first node; and
- a second transistor connected to the second node and having a gate terminal connected to a first data line of the plurality of data lines, wherein, during a compare operation, the match line is coupled to the second line along a signal path passing through the first and second transistors when a signal transmitted on the data line turns on the first transistor and the data value stored at the first node turns on the second transistor.

36. A CAM array including a plurality of CAM cells connected between a match line and a second line, the CAM array also including a plurality of data lines, wherein each CAM cell comprises:
- a latch including cross-coupled inverters forming a first node for storing a data value, wherein the cross-coupled inverters include a transistor connected to a second node and having a gate terminal connected to the first node; and
- means connected to the second node for selectively coupling the match line to the second line along a signal path passing through the first transistor in response to an applied data value when the data value stored at the first node turns on the transistor.

* * * * *